United States Patent [19]

Miyajima

[11] Patent Number: 4,956,609
[45] Date of Patent: Sep. 11, 1990

[54] DIVISIBLE COIL SYSTEM FOR NMR IMAGING APPARATUS

[75] Inventor: Goh Miyajima, Katsuta, Japan

[73] Assignee: Hitachi, Ltd., Tokyo, Japan

[21] Appl. No.: 255,996

[22] Filed: Oct. 11, 1988

[30] Foreign Application Priority Data

Oct. 12, 1987 [JP] Japan ................. 62-254539

[51] Int. Cl.$^5$ ........................... G01R 33/20
[52] U.S. Cl. .......................... 324/322; 324/318
[58] Field of Search ............ 324/318, 320, 322, 300; 128/653 R, 653 A, 653 SC

[56] References Cited

U.S. PATENT DOCUMENTS

| | | | |
|---|---|---|---|
| 4,712,067 | 12/1987 | Roschmann et al. | 324/322 |
| 4,831,330 | 5/1989 | Takahashi | 324/318 |
| 4,887,038 | 12/1989 | Votruba et al. | 324/318 |

FOREIGN PATENT DOCUMENTS

| | | |
|---|---|---|
| 150738 | 8/1985 | Japan . |
| 2145230 | 3/1985 | United Kingdom ............. 324/318 |

OTHER PUBLICATIONS

Cook et al., "A Large-Inductance ... Coil for NMR", J. of Magnetic Resonance, vol. 49, pp. 346-349, 1982.

Primary Examiner—Hezron E. Williams
Assistant Examiner—Kevin D. O'Shea
Attorney, Agent, or Firm—Antonelli, Terry, Stout & Kraus

[57] ABSTRACT

In a nuclear magnetic resonance signal detecting system in which a body subject to measurement placed in a static magnetic field is irradiated with a magnetic field of high frequency by means of a high-frequency magnetic field radiating coil and in which a nuclear magnetic resonance signal of the body is detected by means of a nuclear magnetic resonance signal detecting coil, a high-frequency coil system for the nuclear magnetic resonance measurement comprises a plurality of coil groups juxtaposed to one another in a given direction and each implemented in such a structure as to be divisible in the direction orthogonal to the given direction, for detecting a magnetic field in the axial direction coinciding with an axis extending through the coil groups and/or generating a magnetic field in the axial direction.

38 Claims, 31 Drawing Sheets

DIVISIBLE COIL SYSTEM FOR NMR IMAGING APPARATUS

BACKGROUND OF THE INVENTION

The present invention relates generally to a high-frequency coil system for a NMR (nuclear magnetic resonance) imaging apparatus, and more particularly to a NMR high-frequency coil system implemented in a divisible structure for increasing a filling factor and enhancing manipulatability of the coil system.

The imaging apparatus realized by utilizing the nuclear magnetic resonance or NMR phenomenon (hereinafter referred to as MRI apparatus in abbreviation) is used for obtaining diagnosis information of morbid growths such as cancer or the like of the human body.

In the MRI apparatus, a permanent magnet or a coil-type magnet is employed. In view of heavier weight of the parmanent magnet system, the coil-type magnet system is widely used.

Operation of placing the body to be diagnosed in the static magnetic field generated by the magnet and taking in and out the body therefrom is commonly carried out in a horizontal plane in consideration of facilitation in moving the body lying on a movable table.

In the case of a vertical-field type MRI apparatus in which the static magnetic field is generated in the vertical direction by employing the coil-type magnet, difficulty is encountered more or less in moving the body to be diagnosed in and out of the static magnetic field. For this reason, a horizontal-field type MRI apparatus in which the static magnetic field is generated in the horizontal direction is generally adopted.

In the MRI apparatuses mentioned above, a high-frequency coil is indispensably required for applying a high-frequency magnetic field to the body under inspection for exciting the nuclear magnetic resonance and detecting a high-frequency magnetic field representative of the nuclear magnetic resonance signal resulting from the nuclear magnetic resonance. For such high-frequency coil, there are known two types, i.e. a solenoid-type coil and a saddle-type coil. In view of the intrinsic nature of the nuclear magnetic resonance phenomenon, it is prerequisite that the direction in which the high-frequency magnetic field is applied must be orthogonal not only to the direction of the high-frequency magnetic field generated by the nuclear magnetic resonance but also to the direction of the static magnetic field. In order to meet this condition, the solenoid-type coil, if to be employed, would have to be disposed orthogonally to the static magnetic field. In that case, however, it becomes practically impossible to move the body or object to be inspected in and out of the static magnetic field. In contrast, the saddle-type coil is evaded from this sort of problem and is thus employed commonly.

At this juncture, it is believed that if the high-frequency coil could be implemented in such a structure that it is divisible or separable, a feeling of uneasiness or a sense of oppression of a patient could be mitigated when he or she is moved into and out of the apparatus. More specifically, it is desirable that the coil is divided or separated before the patient is placed in the apparatus for facilitating the positioning of a part to be diagnosed of the body and again unified after the positioning, because then the patient could feel free from the uneasiness and the oppression. On the other hand, in order to enhance the sensitivity, it is desirable to increase the filling factor which is given by the ratio of the volume of the body under inspection to that of the coil system. As an attempt for satisfying the conditions mentioned above, it is known in conjunction with the saddle-type coil to realize it divisible in the vertical direction. Reference may be made to, for example, Japanese Patent Application Laid-Open No. 150738/1985 (JP-A-60-150738). With this known structure of the saddle-type coil, positioning of the body for the diagnosis can certainly be facilitated.

It is further noted that the permanent magnet is more advantageous than the coil-type magnet in view of the low running cost and low leakage magnetic field. Besides, at the present state of the art, the permanent magnet can be improved considerably in the weight as well and thus attracts attention as the magnet for generating a magnetic field of relatively low intensity.

When the permanent magnet is employed, the vertical field type coil system in which the static magnetic field is generated is preferred from the standpoint of positioning of the body to be diagnosed. In the vertical field type system, the use of the solenoid-type coil is desirable which is more sensitive when compared with the sensitivity of the saddle-type coil, because than the high-frequency magnetic field generated by the solenoid-type coil or the high-frequency magnetic field detected by it can be orientated orthogonally to the static magnetic field.

However, in view of the fact that the solenoid-type coil is realized by winding it about the horizontal axis, it will be difficult to divide or separate the coil into two halves in the vertical direction. This is the reason why the vertically divisible or separable solenoid-type coil could not be realized heretofore notwithstanding a high demand existing therefor. In other words, the problem lies in that although the solenoid-type high-frequency coil can be so implemented that the axis thereof extends horizontally when the solenoid-type coil is employed in combination with the parmanent magnet in the vertical-field type MRI system, difficulty is encountered in realizing the solenoid-type high-frequency coil to be divisible or separable.

SUMMARY OF THE INVENTION

An object of the present invention is to provide a high-frequency coil system of the solenoid type or a coil system having performance equivalent to the solenoid-type coil for a NMR imaging apparatus which coil system can be implemented in such a structure that uneasiness or a sense of oppression felt by a person upon positioning his or her body for diagnosis can be fairly mitigated.

In view of the above object, there is provided according to the present invention in its broadest aspect a high-frequency coil system for a NMR imaging apparatus which system comprises a plurality of coil groups juxtaposed in a given direction, wherein the coil groups are so arranged as to be separable in the direction orthogonal to the given direction and adapted to generate a high-frequency magnetic field in the given direction passing through the coil groups and/or detect a high-frequency magnetic field generated in the given direction.

Owing to the juxtaposition of the coil groups in a given direction, each coil group can serve for a same or equivalent function as the solenoid-coil. Further, because of the structure divisible in the direction orthogo-

DESCRIPTION OF THE PREFERRED EMBODIMENTS

Figure 1:
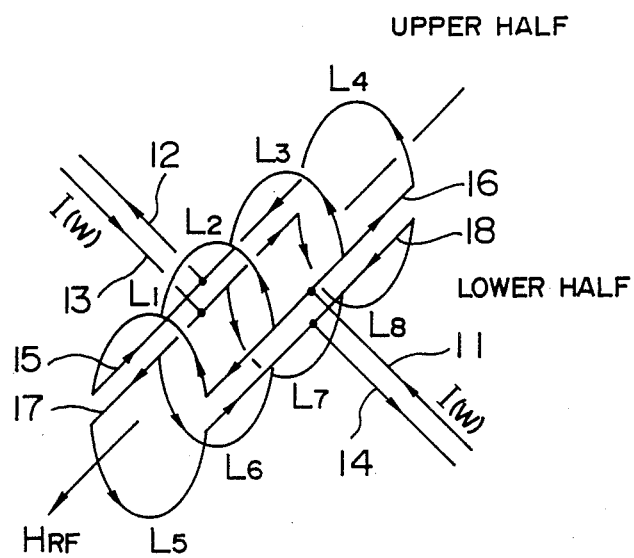
FIG. 1 is a schematic diagram showing a basic structure of a NMR high-frequency coil system according to an embodiment of the present invention.
Figure 1:
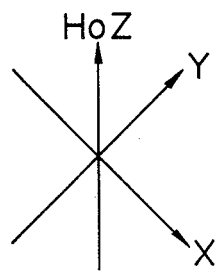

FIG. 1 shows a basic structure of a NMR high-frequency coil system according to an embodiment of the present invention. More specifically, the coil system of the basic structure is divisible or separable in the Z-direction (e.g. vertical direction) and serves for the same or equivalent functions as the solenoid-type coil for generating or radiating a high-frequency magnetic field to excite the nuclear magnetic resonance or (NMR) and/or detecting a NMR magnetic field signal, as will be described below in more detail by referring to FIGS. 1A to 1F.

Figure 1A:
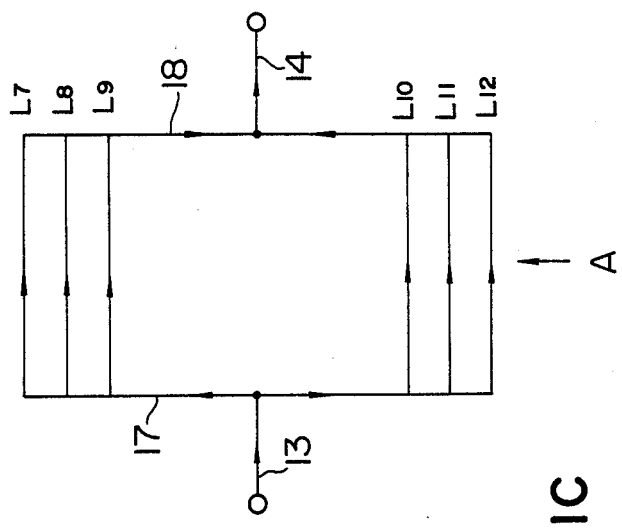
FIGS. 1A to 1F are schematic diagrams for illustrating in more detail an exemplary embodiment of the NMR high-frequency coil system based on the principle illustrated in FIG. 1.
Figure 1B:
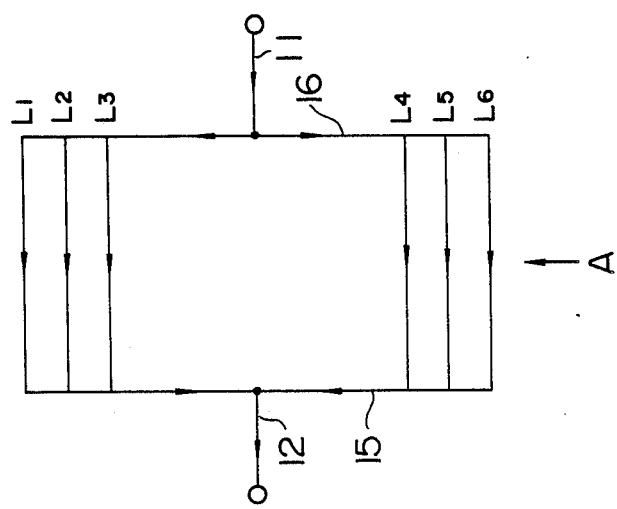
Figure 1C:
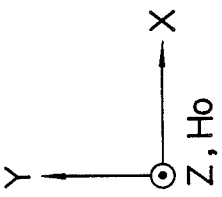
Figure 1D:
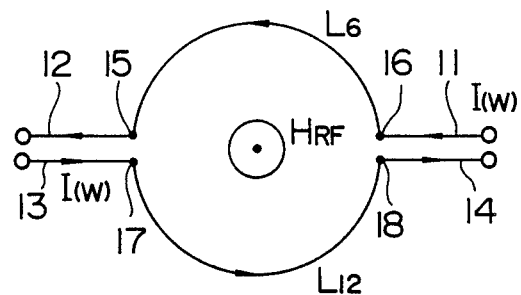
Figure 1F:
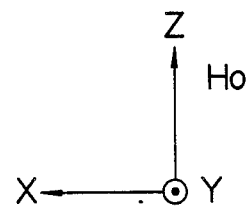
Figure 1E:
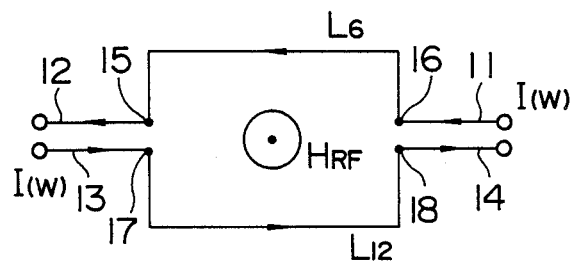

As is shown in FIGS. 1E and 1F, a static magnetic field $H_o$ is applied in the Z-direction.

FIGS. 1A and 1B are plan views of upper and lower halves of the coil system in the X-Y plane of a X-Y-Z-coordinate system, as shown in FIG. 1C, while FIGS. 1D and 1E are plan views in the X-Z plane of the coordinate system, as shown in FIG. 1F. In other words, FIGS. 1D and 1E are views taken in the directions indicated by arrows A in FIGS. 1A and 1B, respectively. Although the illustrated coil system is shown to assume a circular section (FIG. 1D) or a rectangular section (FIG. 1E) as viewed in the Y-axis direction, it should be understood that the coil system may have an elliptical or square cross-section as well. To say in another way, FIGS. 1A and FIG. 1B show the configurations of the coil system as viewed from the top and the bottom of FIGS. 1D and 1E, respectively. In these figures, reference symbols $L_1$ to $L_{12}$ represent resonance line (wire) elements of the coil conductor (formed of copper material in general) and inductances thereof. In the upper coil half shown in FIG. 1A, the resonance line (wire) elements are short-circuited through line elements 15 and 16 (wires or conductors of copper in general), while the resonance line elements in the lower coil half shown in FIG. 1B are short-circuited to one another by way of line elements 17 and 18 (wires or conductors of copper).

Although six resonance line elements are shown in FIGS. 1A and 1B, it will readily be understood that they are only for the purpose of illustration and can be selected rather arbitrarily as the case may be. Further, it should be mentioned that the resonance line (wire) elements may be absent in he center region of the coil system. A static capacity element $C_r$ for resonance (hereinafter referred to simply as capacitor) is mounted externally, although not shown.

For facilitating the understanding, it is assumed that a high-frequency current $I(\omega)$ is forced to flow from a lead wire 11 in the upper coil half, while the same current is forced to flow from a lead wire 13 in the lower coil half. These currents flow in the directions indicated by arrows in FIGS. 1A, 1B and 1D or 1E. At this juncture, it holds true that $\omega = 2\pi f_o$, $f_o$ represents NMR resonance frequency.

In the state where the upper and lower coil halves are unified, as shown in FIG. 1D or 1E, the currents in the individual resonance line elements flow in the counter-clockwise direction, so to say, which results in that a high-frequency magnetic field ($H_{RF}$) is generated in the direction perpendicularly to the plane of the drawing (FIG. 1D or 1E).

Of course, the current flows through each of the line elements 15, 16, 17 and 18. However, since the currents flow in the opposite directions through the line elements 15 and 17 which are disposed closely adjacent to each other and through the line elements 16 and 18 disposed also closely to each other, the high-frequency magnetic fields ($H_{RF}$) generated by the currents flowing through the line (wire) elements 15 and 17 cancel out each other, while the high-frequency magnetic fields ($H_{RF}$) generated by the currents flowing through the line elements 16 and 18 are also mutually canceled out. Consequently, it may be regarded that the high-frequency magnetic field components induced by the currents flowing through the line elements 15, 16, 17 and 18 are substantially of no influence.

The same is also true in the case of the high-frequency magnetic fields ($H_{RF}$) generated due to the currents flowing through the lead wires. More specifically, since the lead wires 11 and 14 on one hand and the lead wires 12 and 13 on the other hand are paired with each other with the currents flowing in the opposite directions in each pair, the high-frequency magnetic fields ($H_{RF}$) generated by the currents flowing through the lead wires 11, 14 and 12, 13 are mutually canceled out. Thus, the magnetic field components ($H_{RF}$)) generated by the currents flowing through these lead wires may be regarded to be substantially zero.

It will thus be appreciated from the above description that in the circuit network configured as shown in FIG. 1, only the magnetic field ($H_{RF}$) can be generated in the direction perpendicular to the plane of the drawing by supplying simultaneously the current $I(\omega)$ to the upper and lower coil halves through the respective lead wires 11 and 13.

Figure 19:
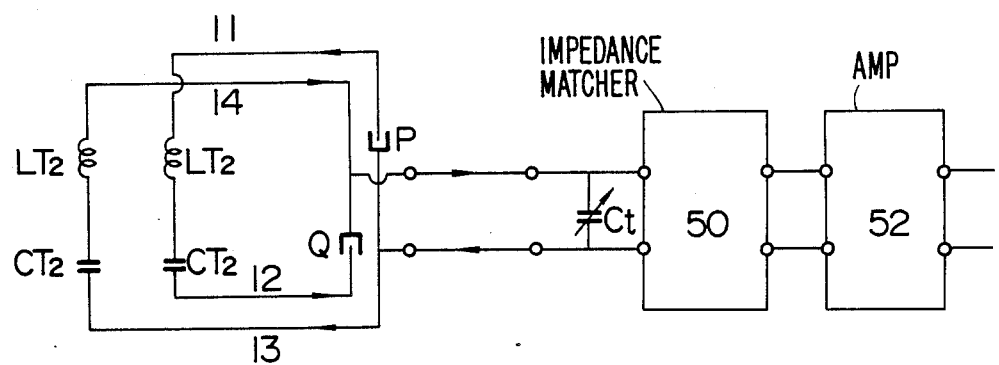
FIG. 19 is a diagram showing a circuit diagram relevant to the coil system shown in FIG. 1.

On the other hand, it can also be understood from the above description that in case the magnetic field ($H_{RF}$) is present in the direction perpendicular to the plane of the drawing, a high-frequency current will flow through the circuit network mentioned above, whereby the current can be detected by way of the lead wires 11, 12, 13 and 14. In other words, the circuit network can also be employed for detecting the NMR magnetic field signal in addition to the function for generating or radiating the high-frequency magnetic field for the excitation of NMR. In this conjunction, an exemplary embodiment of the NMR detecting coil in the MRI apparatus for a head portion of the human body is shown in FIGS. 18A–18D and an associated circuit diagram is shown in FIG. 19, which will be described in detail hereinafter.

FIGS. 2A to 2E show a basic structure of the coil system according to another embodiment of the present invention in which electrostatic capacity elements for resonance (hereinafter referred to simply as capacitor) $C_i$ (i=1, 2, ..., 12) are connected in series to the resonance line elements $L_i$, respectively. In each of the resonance line elements, the inductance $L_i$ and the capacitor $C_i$ are so adjusted to establish the tuning with the NMR resonance frequency $f_o$ given by the following expression (1):

$$f_o = \frac{1}{2\pi \sqrt{L_i C_i}} \qquad (1)$$

Due to realization in the form of a distributed constant circuit network in this way, the number of the resonance line elements can be increased even for a high NMR resonance frequency $f_o$ to advantage.

Since this circuit network is of a symmetrical form, $$\left. \begin{array}{l} L_1 = L_6 = L_7 = L_{12} \\ L_3 = L_4 = L_9 = L_{10} \\ L_2 = L_5 = L_8 = L_{11} \end{array} \right\} \qquad (2)$$

Accordingly, $$\left. \begin{array}{l} C_1 = C_6 = C_7 = C_{12} \\ C_3 = C_4 = C_9 = C_{10} \\ C_2 = C_5 = C_6 = C_{11} \end{array} \right\} \qquad (3)$$

As discussed by B. Cook in his article contained in "Journal of Magnetic Resonance", 49, p. 346 (1982), the following relations applies valid.

$$\left. \begin{array}{l} L_1 \approx L_0 (1 + k) \\ L_2 \approx L_0 (1 + 2k) \\ L_3 \approx L_0 (1 + k) \end{array} \right\} \qquad (4)$$

where k represents a magnetic coupling constant, and $L_0$ represents inductance of a resonance line element existing independently. From the expressions (4), it is apparent that $$L_1 = L_3 \qquad (5)$$

FIGS. 3A to 3E show a basic structure of a NMR high-frequency magnetic field coil which is a modification of the structure shown in FIGS. 2A to 2E and in which the upper coil half and the lower coil half are asymmetrical with each other.

More specifically, let's assume that the number of the resonance line elements is to be different between the upper coil half and the lower coil half for a given total number of the line elements of the coil system. In that case, the length of the resonance elements is made different between the upper half coil and the lower half coil such that the total inductance of the former is equal to that of the latter. By way of example, in the case of the asymmetrical structure shown in FIGS. 3A to 3E where the number of the resonance line elements constituting the upper coil half is twice as large as that of those of the lower coil half, the length of the resonance line elements of the upper half coil may be so adjusted that the inductance (inclusive of the contribution of the above-mentioned magnetic coupling factor) of the resonance line element of the upper coil half is twice as high as that of the resonance line element of the lower coil half so that the total inductance of the upper coil half is equal to that of the lower coil half. With such arrangement, the resonance line elements of the upper coil half are equivalent to those of the lower coil half in respect to the impedance (Z) between the lead wires 11 and 12 and the lead wires 13 and 14, respectively, whereby the circuit network configuration easy to handle can be realized. In the case of the structure shown in FIGS. 3A to 3E, each resonance line element includes a capacitor. It should however be appreciated that the circuit can also be configured similarly even in case where no capacitor is incorporated.

Figure 4A:
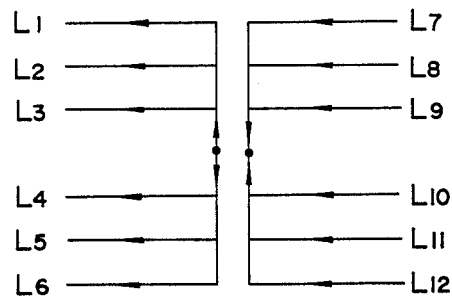
FIGS. 4A to 4F are schematic diagrams showing a basic structure of a NMR high-frequency coil system according to another embodiment of the present invention.
Figure 4B:
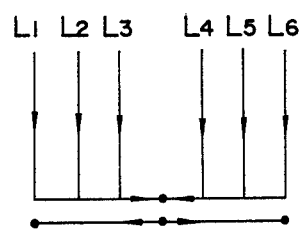
Figure 4C:
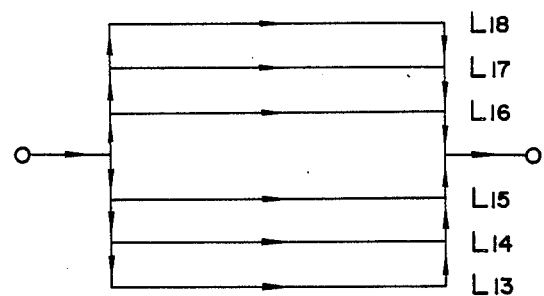
Figure 4D:
Figure 4E:
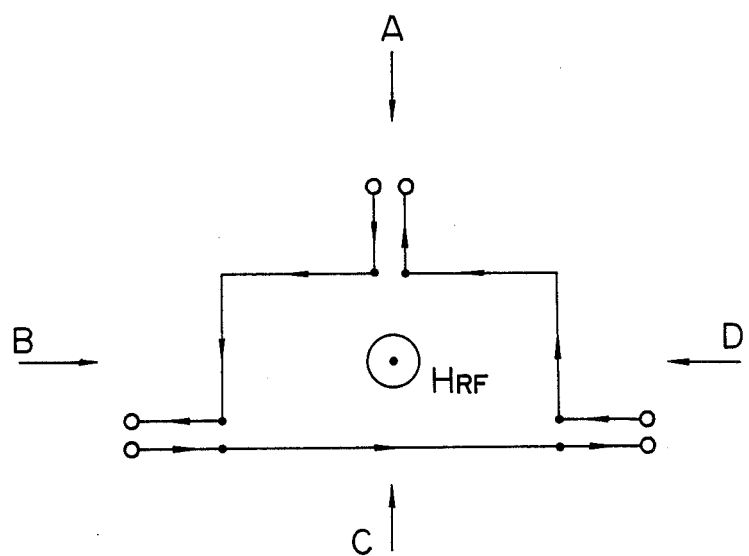
Figure 4F:
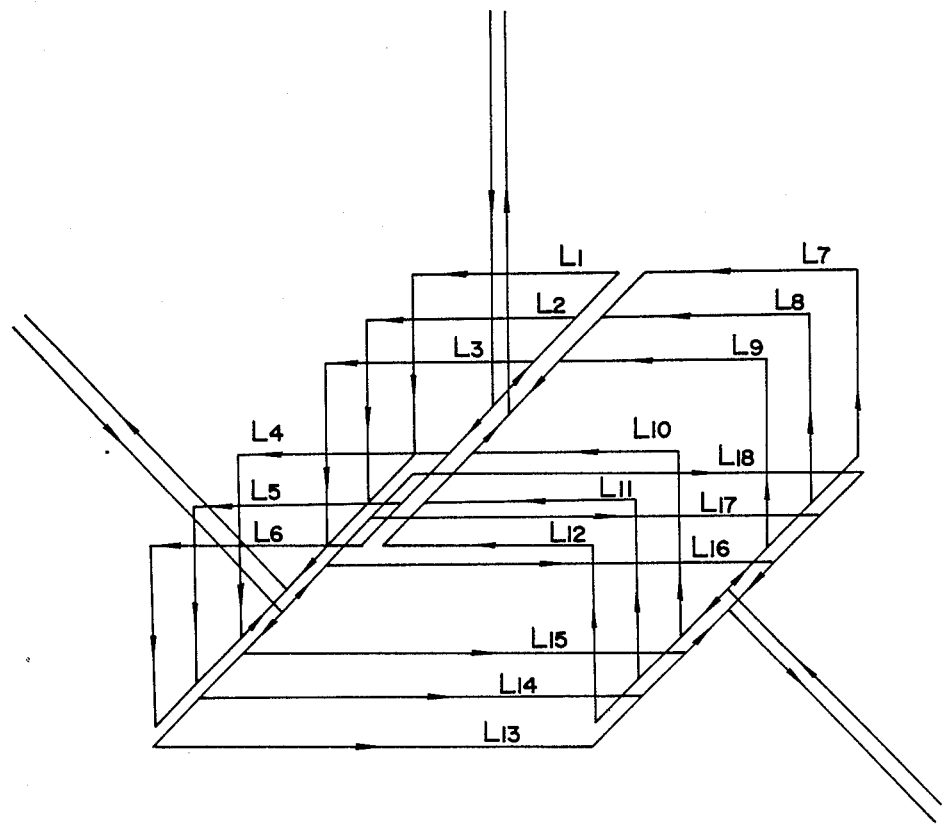

FIGS. 4A to 4E show a basic circuit configuration of a NMR high-frequency coil system according to a modified embodiment of the present invention in which the coil is divided into three parts as illustrated in FIG. 4F such that each resonance line element of the three coil parts resulting from the division has a substantially same inductance.

In the case of the illustrated structure, the three divided coil parts are equal to one another (1) in respect to the number of the resonance line elements and (2) in respect to impedance. Consequently, the coil structure shown in FIGS. 4A to 4E can be handled more easily than the coil structure shown in FIG. 3. Although each resonance line element includes no capacitor in the circuit configuration shown in FIG. 4, it will be readily understood that the coil system shown in FIG. 4 may be realized in the form of a distributed constant circuit in which each resonance line element includes a capacitor. Parenthetically, FIG. 4B is a view taken in the direction indicated by an arrow B in FIG. 4E, while FIG. 4C is taken in the arrowed direction C with FIG. 4D being taken in the direction D.

Figure 5:
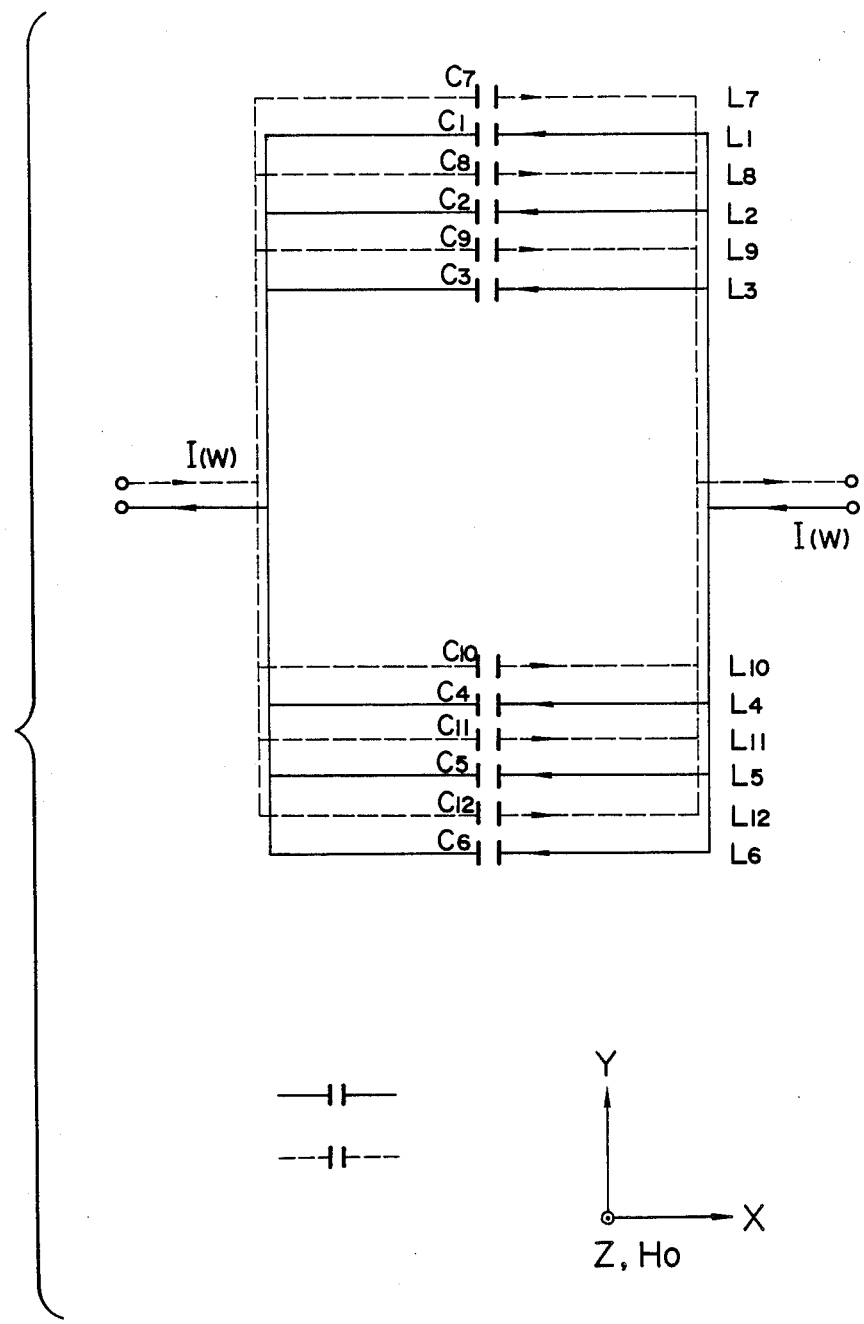
FIG. 5 is a schematic diagram showing a basic structure of a NMR high-frequency coil system according to still another embodiment of the invention.
Figure 6:
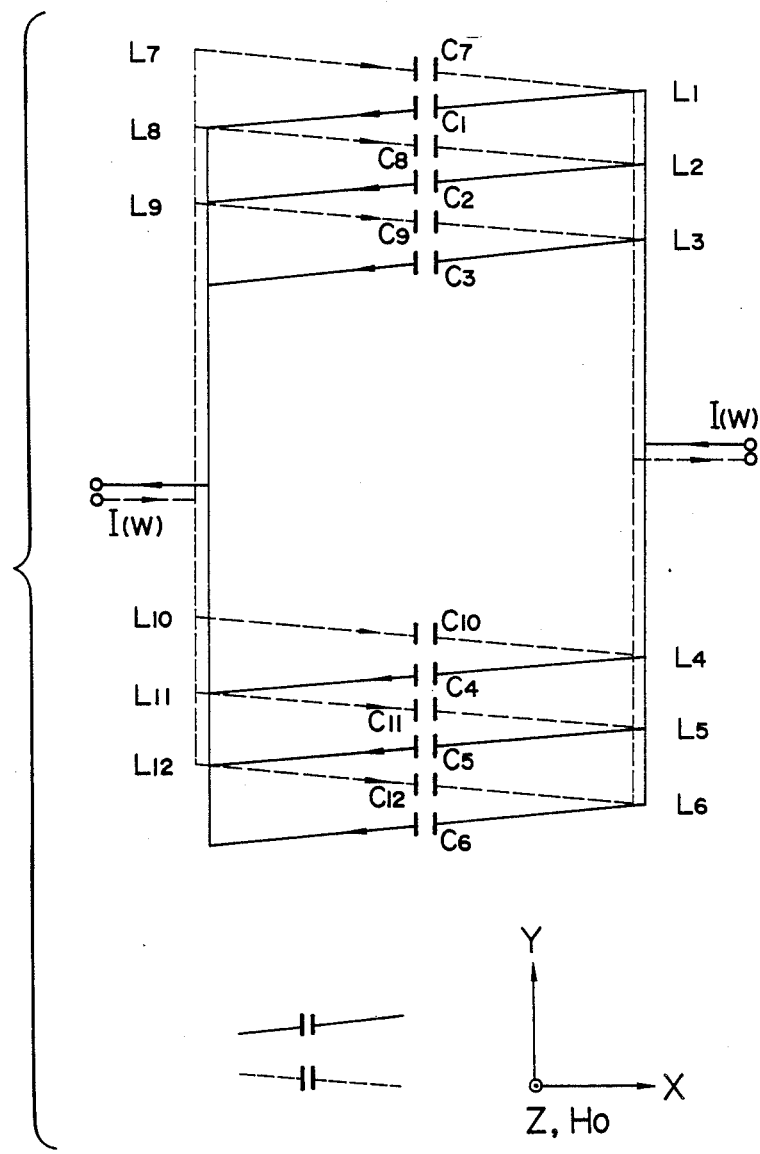
FIG. 6 is a schematic diagram showing a basic structure of a NMR high-frequency coil system according to a further embodiment of the invention.

FIGS. 5 and 6 show, respectively, modifications of the embodiment of the coil system shown in FIG. 2. In the case of the coil structure shown in FIG. 5, the resonance line elements of the upper coil half and those of the lower coil half are alternately disposed as viewed from the top of the coil. With this coil structure, it is possible to generate a high-frequency magnetic field approximating to that generated by the solenoid coil. Further, the coil system shown in FIG. 6 approximates more closely to the structure of the solenoid coil than the coil system shown in FIG. 5 to further advantage. Parenthetically, the coil systems shown in FIGS. 5 and 6 present such configuration as shown in FIG. 2D or 4E when viewed in the direction in which the high-frequency magnetic field is generated.

It should further be added that although the coil systems shown in FIGS. 5 and 6 are realized in the form of the distributed constant circuit in which each resonance line element includes a capacitor, the latter may be spared if desired.

Now, description will be directed to the means for dividing separably the high-frequency magnetic field coil system.

The means for dividing separably the coil system may generally be classified into two categories mentioned below:

(i) separable mechanical coupling elements (designated by P and Q in FIGS. 12A–12D and others), and (ii) separable electrostatic capacity element (represented by capacitor C).

Further, auxiliary means such as flexible mechanical coupling element (designated by F) exemplified by a flexible interleaved metal wire, a metal bellows, thin metal sheet, hinges or the like may be employed in combination with the separable elements mentioned above.

FIGS. 7A to 7H show examples of the separable mechanical coupling elements (i).

Figure 7A:
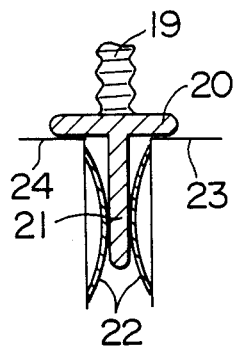
FIGS. 7A to 7H are views showing separable mechanical coupling elements which can be employed in carrying out the present invention.
Figure 7B:
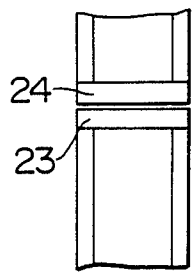
Figure 7C:
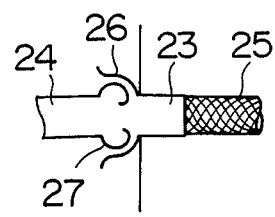
Figure 7D:
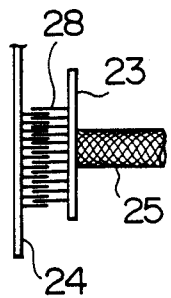
Figure 7E:
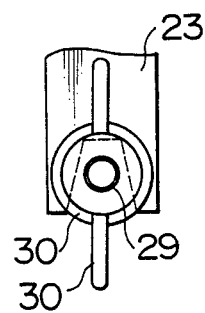
Figure 7F:
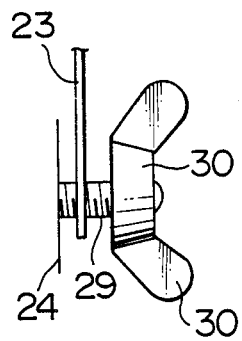
Figure 7G:
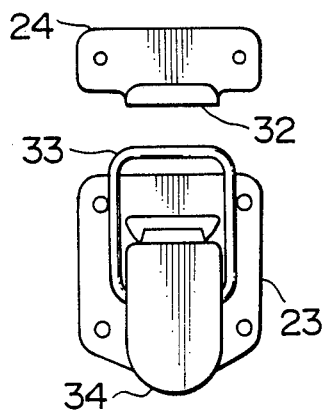
Figure 7H:
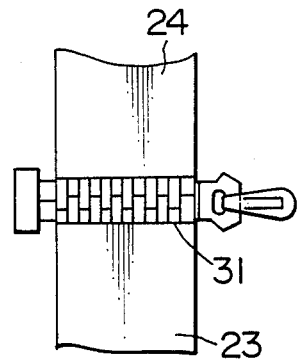

More specifically, referring to FIG. 7A, portions 23 and 24 to be contacted with each other are mechanically and electrically brought into contact by means of a metallic insert member 21 adapted to be inserted between metal springs 22 attached to the portions 23 and 24, respectively, under action of a bellows 19. The mechanical coupling shown in FIG. 7B is accomplished by contacting together the portions 23 and 24 under pressure. In the mechanical coupling means shown in FIG. 7C, the portions 23 and 24 are electrically contacted by means of a so-called hook mechanism including metallic resilient members 26 and 27 adapted to engage with each other. The coupling means shown in FIG. 7D is constituted by a pair of metal brushes 28 adapted to interlock together to thereby electrically connect the portions 23 and 24. The coupling means shown in FIGS. 7E and 7F is constituted by a combination of a threaded bolt 29 and a wing nut 30. In FIG. 7G, there is shown a clasp mechanism including a hook 32 and a latch ring 33 which is conventionally employed in a box provided with a hinged cover, while FIG. 7H shows a metal fastener 31 used in articles of clothing. Further, a BNC-type connector often used as the high frequency connector can be equally made use of, although not shown. In FIGS. 7A to 7H, reference numeral 20 denotes a collar serving as a stopper, 25 denotes a flexible stranded wire, and 34 denotes a pressing knob.

Figure 8A:
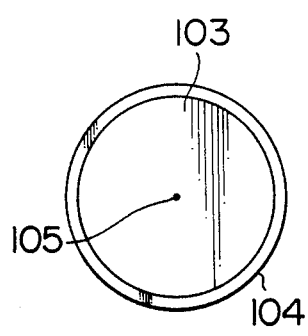
FIGS. 8A to 8D are views for illustrating the principle of a separable electrostatic capacity element (capacitance element) which can be employed in carrying out the invention.
Figure 8B:
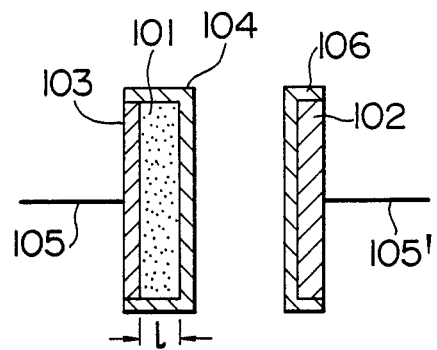
Figure 8C:
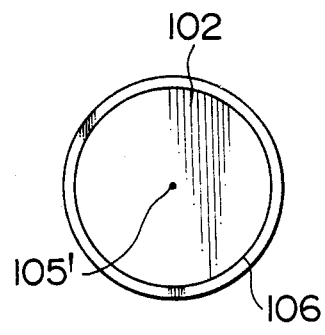

FIGS. 8A to 8D and FIGS. 9A to 9C are views illustrating the principle and exemplary structures of the coupling capacitors (ii) mentioned hereinbefore. Referring first to FIGS. 8A to 8C, reference numerals 102 and 103 denote metallic terminal plates which are disposed in opposition to each other and which are formed of an electrically conductive material such as, for example, copper. The surface of the terminal plate 102 disposed to face the terminal plate 103 should preferably be formed with an electrically insulating film 106 for the purpose of protecting the terminal plate 102 from oxidation and injury. A terminal wire 105' is led out from the other surface of the terminal plate 102.

On the other hand, a dielectric material layer 101 is formed over the surface of the terminal plate 103 which faces the terminal plate 102, wherein a film 104 is so formed as to cover the dielectric material layer 101 for thereby protecting the latter from injury. A terminal wire 105 is led out from the other surface of the terminal plate 103.

Figure 8D:
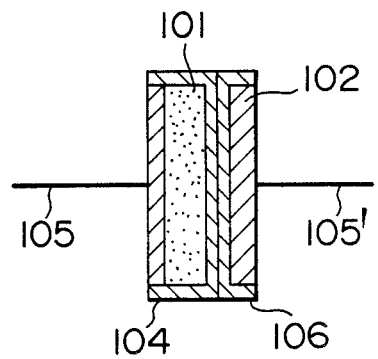

By disposing the terminal plates 102 and 103 such that the films 104 and 106 are intimately contacted as shown in FIG. 8D, there can be realized a structure having a function of an electrostatic capacity element (capacitor) with the dielectric material layer 101 being interposed between two plates. It goes without saying that the terminal plates 102 and 103 can be separated from each other.

The capacity C of the capacitor shown in FIG. 8D is given by $$C = \frac{\epsilon_o \cdot \epsilon_r \cdot A}{l} \, (F)$$

where
$\epsilon_o$: dielectric constant of vacuum $= 8.8542 \times 10^{-12}$ F/m,
$\epsilon_r$: specific dielectric constant of the dielectric material,
A: area of the terminal plate (m$^2$), and
l: thickness of the dielectric material (m).

Next, description will be made of a concrete structure of the electrostatic capacity type coupling element implemented on the basis of the principle described above by reference to FIGS. 8A to 8D.

Figure 9A:
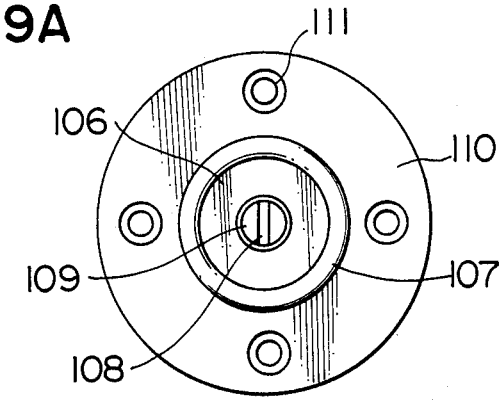
FIGS. 9A to 9C are views showing in greater detail an exemplary structure of the electrostatic capacity element shown in FIGS. 8A to 8D.
Figure 9B:
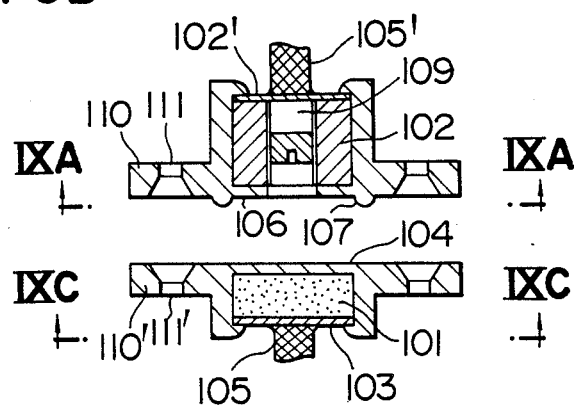
Figure 9C:
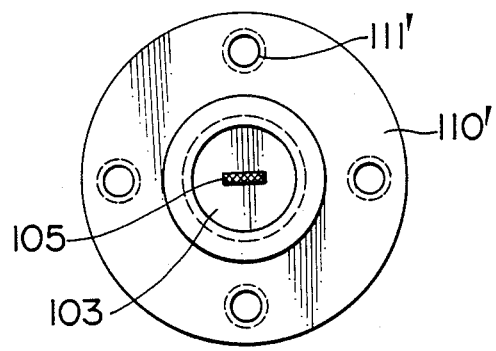

FIGS. 9A to 9C show a concrete example of the structure of the electrostatic capacity element according to an embodiment of the invention, wherein FIG. 9B is a sectional view, and FIGS. 9A and 9C are plan views as viewed in the directions indicated by arrows 1XA and 1XC, respectively, in FIG. 9B. In these figures, same reference numerals as those used in FIGS. 8A to 8C denote like or equivalent parts. The structure shown in FIGS. 9A to 9C differs from that shown in FIGS. 8A to 8C in that supporting structures 110 and 110' are provided integrally with the electrically insulating films 104 and 106, respectively. More specifically, in the terminal plate 103, the supporting structure 110' is formed so as to enclose therein the dielectric material layer 101, wherein the insulation film 104 covering the surface of the dielectric material layer 101 facing the counterpart terminal plate 102 is formed integrally with the supporting structure 101' which has a peripheral flange having a face extending flush with the outer surface of the insulation film 104 and serving for the supporting function.

In the terminal plate 102, a supporting structure 110 is formed in a similar manner, wherein a peripheral flange is provided with a plurality of threaded holes 111 in positional alignment with those formed in the flange of the supporting structure 110' so that the supporting structures 110 and 110' can be coupled together by means of screws mating with the threaded holes 111 and 111', respectively.

Referring to FIG. 9B in particular, a threaded bore 109 is formed at the center portion of the terminal plate 102 for receiving screwwise therein a movable piece 102 for the purpose of making available a desired capacity by moving finely the movable piece 108. The threaded bore 109 as well as the movable piece 108 may be plated with silver or gold for protecting them from incrustation of rust.

Each of the terminal wires 105 and 105' is realized in the form of a stranded wire having a large surface area in view of a high-frequency current to be conducted therethrough. An additional terminal plate 102' is provided to which the terminal wire 105' is connected and which is integrally combined with the terminal plate 102 to constitute a unified structure. The supporting structure 110 is formed with a ring-like protrusion 107 on the surface facing the counterpart terminal plate 103 in a height of 10 to 50 μm with a view to preventing change in the capacity by excluding variation in the gap size upon securing together of the upper and lower terminal plate structures. The variation in the gap and hence change in the capacity would otherwise occur due to interposition of dust or the like foreign particles. In this connection, the surface area of the ring-like protrusion should be as small as possible. To this end, a plurality of point-like projections may be provided in place of the ring-like protrusion.

Figure 10:
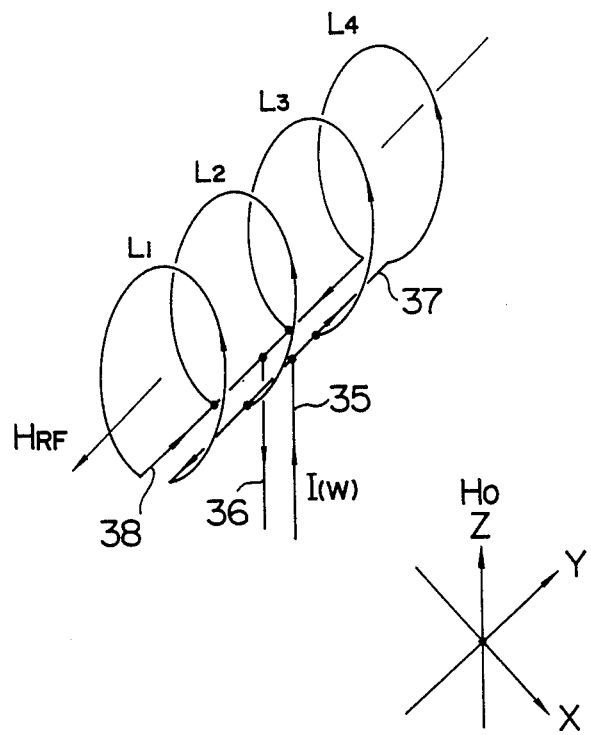
FIG. 10 is a schematic diagram showing a basic structure of the NMR high-frequency coil system according to another embodiment of the present invention.

FIG. 10 shows in a schematic perspective diagram a coil system according to another embodiment of the present invention used for detection of the NMR magnetic field signal and/or generation of high-frequency magnetic field for exciting NMR, as will be described below.

In FIG. 10, $L_1$, $L_2$, $L_3$ and $L_4$ represent resonance line elements (also referred to as coil element or simply as coil) as well as inductances thereof, respectively. For simplification of the description, it is assumed that $L_1=L_2=L_3=L_4$, wherein mutual magnetic coupling is neglected.

Assuming now that a high-frequency current $I(\omega)$ is forced to flow through a lead wire 35 in the direction indicated by an arrow, the high-frequency current $I(\omega)$ is divided among the resonance line elements $L_1$, $L_2$, $L_3$ and $L_4$ to flow in the directions indicated by the associated arrows, respectively, whereby a high-frequency magnetic field $H_{RF}$ is generated within the coil constituted by the resonance line elements $L_1$ to $L_4$. To say in another way, high-frequency currents can be induced in the coil or line elements $L_1$, $L_2$, $L_3$ and $L_4$ in the same direction when a high-frequency magnetic field $H_{RF}$ is present. Thus, it will be understood that the coil system under consideration can be used for the detection of the NMR magnetic signal and/or for radiation of the high-frequency magnetic field.

Since the lead wires 35 and 36 are located closely to each other, the magnetic fields generated by the high-frequency currents $I(\omega)$ flowing therethrough in opposite directions, respectively, are mutually canceled out, whereby n unwanted magnetic field components makes appearance. The same holds true in the case of the line elements 37 and 38, involving no disturbance in generation of the high-frequency magnetic field $H_{RF}$ for irradiation. Of course, falsified detection of the NMR magnetic field by these line elements 37 and 38 can never occur. Although the illustrated coil system is assumed to include four resonance line elements $L_1$ to $L_4$, it is obvious that the number of these line elements can be increased or decreased, as the case may be.

FIGS. 10A to 10I are views showing schematically various exemplary embodiments of the coil system which have the basic structure described above by referring to FIG. 10 and which are separably divisible into two halves, respectively. In FIGS. 10A to 10I, only a single resonance line element $L_1$ is shown. It should however be understood that each of the illustrated coil systems includes a number of resonance line elements $L_1$ to $L_n$ (where n represent a given integer), as will be seen in FIG. 10. The lead wires 35 and 36 are same as those shown in FIG. 10 and designated by same reference numerals. The reference numerals 37 and 38 also designate the same line elements as those shown in FIG. 10. A reference numeral 39 designates a capacitor having a separable structure described hereinbefore by referring to FIGS. 8A–8D and 9A–9C. The capacitor 37 is connected in series with each of the resonance line element. Reference characters P and Q denote separable mechanical coupling elements or mechanisms described hereinbefore in conjunction with FIGS. 7A–7H and adapted to be inserted in series to each resonance element. A reference character F represents a flexible mechanical coupling member also described hereinbefore and adapted to be connected in series to each resonance line element. A reference symbol $C_r$ denotes a capacitor inserted between the lead wires 35 and 36 when each of the resonance line elements $L_1$ to $L_n$ incorporates therein no capacitor and serves for tuning the coil system to the NMR resonance frequency $f_o$. Further, a reference symbol $C_t$ represents a variable capacitor serving for fine adjustment upon tuning the coil system to the NMR resonance frequency $f_o$ by means of the capacitor 39 or $C_r$. This vairable capacitor $C_t$ is inserted between the lead wires 35 and 36. When each of the resonance line elements includes the capacitor 39, there is realized a distributed-constant type coil system in which each resonance element is tuned to the NMR resonance frequency $f_o$.

Figure 10A:
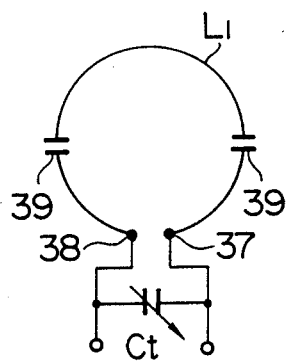
FIGS. 10A to 10I are schematic diagrams showing further embodiments and versions of the NMR high-frequency coil system according to the invention.

FIG. 10A shows a coil system which can be separably divided into an upper coil half and a lower coil half by the capacitors 39 located at left and right sides, respectively, as viewed in the figure.

Figure 10B:
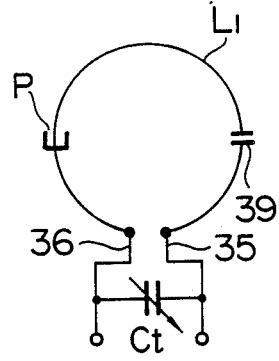

FIG. 10B shows a coil system which is adapted to be separably divided into an upper coil half and a lower coil half by mechanical coupling element P.

Figure 10C:
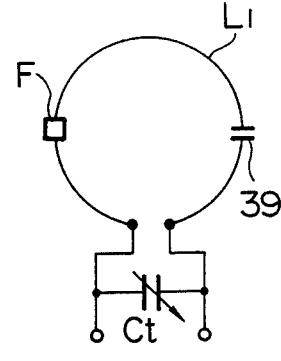
Figure 16:
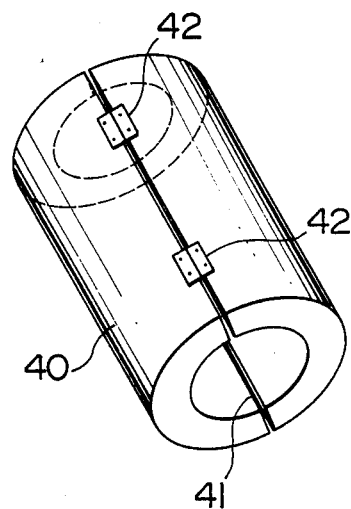
FIG. 16 is a view showing an outer appearance of an NMR high-frequency coil system divisible or separable at one location.

FIG. 10C shows a one-side openable coil system incorporating the seprable capacitor 39 and the flexible mechanical coupling element F. An exemplary structure of the one-side openable coil system is shown in FIG. 16.

Figure 10D:
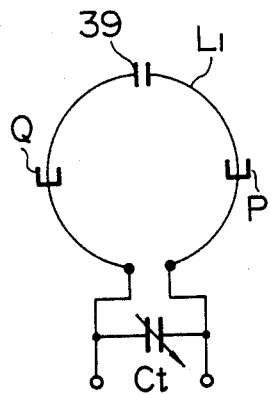

FIG. 10D shows a distributed-constant type coil system which can be separably divided into upper and lower coil halves by means of the separable mechanical coupling elements P and Q.

Figure 10E:
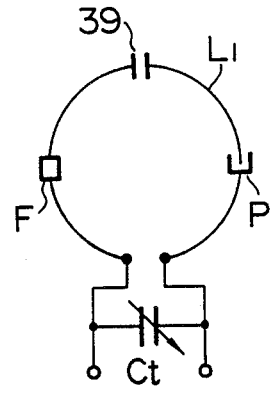

FIG. 10E shows a one-side openable distributed-constant type coil system incorporating the separable mechanical coupling element P and the flexible mechanical coupling element F.

Figure 10F:
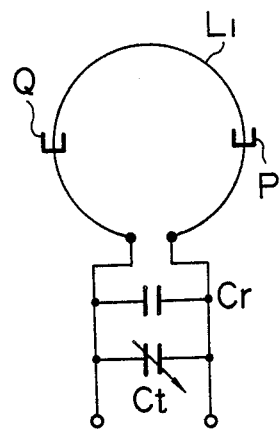

FIG. 10F shows a coil system separably divisible into upper and lower coil halves by means of the separable mechanical coupling elements P and Q.

Figure 10G:
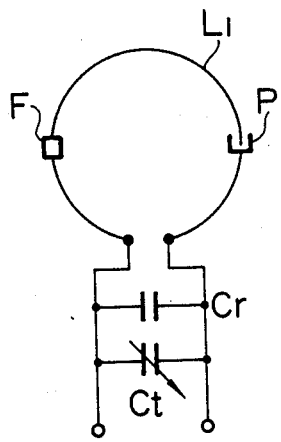

FIG. 10G shows a one-side openable coil system incorporating the separable mechanical coupling element P and the flexible mechanical coupling element F.

Figure 10H:
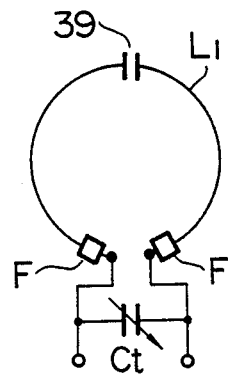

FIG. 10H shows a distributed-constant type coil system adapted to be separably divisible into a left coil half and a right coil half. To this end, the coil system includes a pair of the flexible mechanical coupling elements provided at both ends of the resonance line element, respectively, and one separable capacitor 39 disposed at the top of thereof.

Figure 10I:
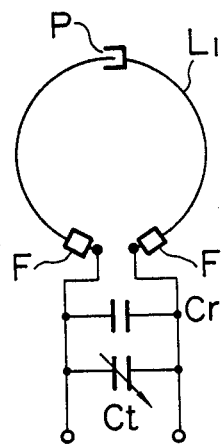

FIG. 10I shows a coil system of the structure similar to the one shown in FIG. 10H except that the separable capacitor 39 is replaced by the separable mechanical coupling element P.

Figure 11A:
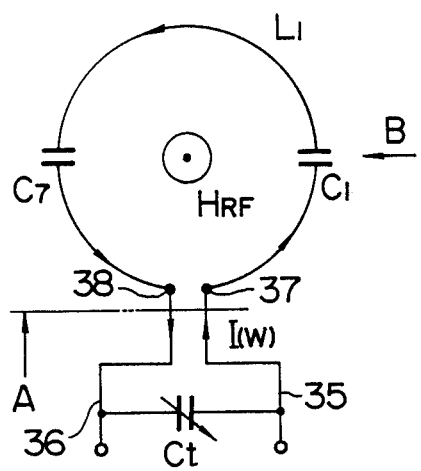
FIGS. 11A to 11D are views showing in more detail the structure of the coil system shown in FIG. 10A.
Figure 11B:
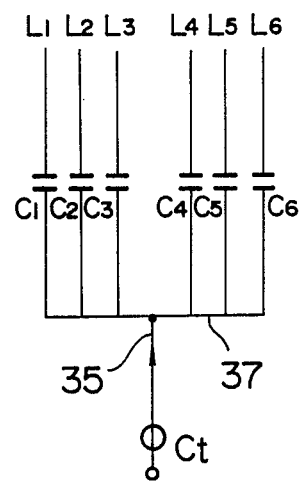
Figure 11C:
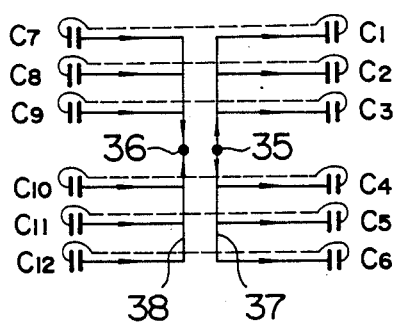

FIGS. 11A to 11D are views illustrating in greater detail the structure of the coil system shown in FIGS. 10A, wherein FIG. 11C is a view taken along the direction indicated by an arrow A in FIG. 11A while FIG. 11B is a view taken in the direction indicated by an arrow B in FIG. 11A. The coil system shown in FIGS. 11A to 11D includes six resonance line elements incorporating paired separable capacitors ($C_1$, $C_7$; $C_2$, $C_8$; $C_3$, $C_9$; $C_4$, $C_{10}$; $C_5$, $C_{11}$ and $C_6$, $C_{12}$), respectively, connected in series and is realized in the form of a distributed constant circuit tuned to the NMR frequency $f_o$.

Assuming that $$C_1=C_7, C_2=C_8, C_3=C_9, C_4=C_{10}, C_5=C_{11} \text{ and } C_6=C_{12} \quad (6)$$

the NMR frequency $f_o$ is given by $$f_o = \frac{1}{2\pi \sqrt{L_i C_i}} \quad (i = 1, 2, 3, 4, 5, 6) \quad (7)$$

By virtue of such arrangement that the resonance line elements $L_1$, $L_2$ and $L_3$ are grouped in one set while the resonance line elements $L_4$, $L_5$ and $L_6$ being grouped in another set, wherein both groups or sets are distanced from each other at the resonance line elements $L_3$ and $L_4$ symmetrically to each other, as shown in FIG. 11B, the following equations apply valid.

$$L_1=L_6, L_3=L_4, L_2=L_5 \quad (8)$$

Taking into consideration the magnetic coupling between the resonance line elements, then, from the expression (4), $$\left.\begin{array}{l} L_1 \approx L_0(1 + k) \\ L_2 \approx L_0(1 + 2k) \\ L_3 \approx L_0(1 + k) \end{array}\right\} \quad (4')$$

Thus, from the expression (4'), $$L_1=L_3=L_4=L_6 \quad (5')$$

Figure 11D:
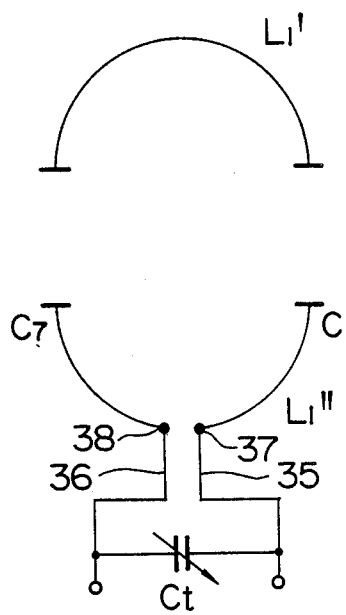

In FIG. 11D, there is shown in what manner the coil system can be separably divided into the upper coil half and the lower coil half by means of the separable capacitors $C_i$ (i=1 to 12).

Figure 12A:
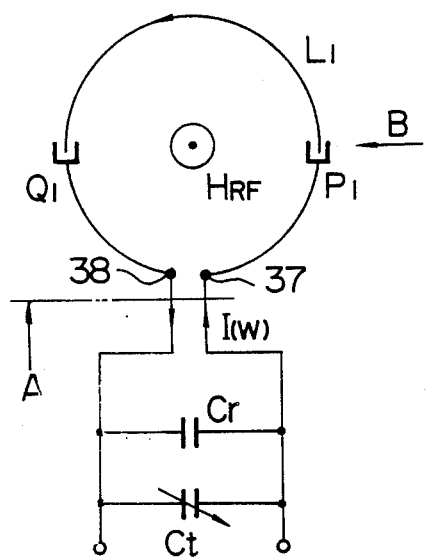
FIGS. 12A to 12D are views showing in more detail the structure of the coil system shown in FIG. 10F.
Figure 12B:
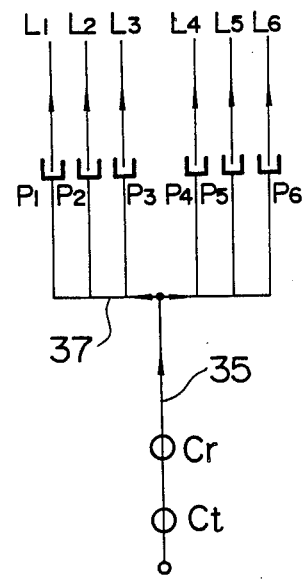
Figure 12C:
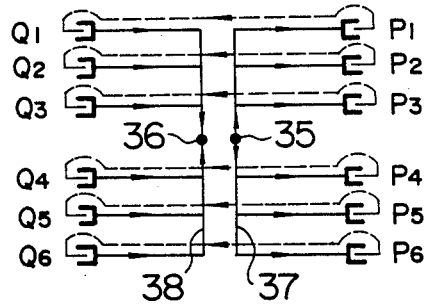

FIGS. 12A to 12D are views showing in greater detail the NMR coil system structure shown schematically in FIG. 10F, wherein FIG. 12C is a view taken in the viewing direction indicated by an arrow A in FIG. 12A while FIG. 12B is a view taken in the direction indicated by an arrow B.

The instant embodiment of the NMR coil system also includes six resonance line elements. However, no capacitor is incorporated in any resonance line element. The NMR coil system has a combined inductance L given by the following expression (10).

$$\frac{1}{L} = \Sigma \frac{1}{L_i} \quad (i = 1, 2, 3, 4, 5, 6) \quad (10)$$

By this resultant inductance L and the externally mounted capacitor $C_r$ which is mounted externally to a resonance line element, the coil system is turned to the NMR resonance frequency $f_o$ given by $$f_o = \frac{1}{2\pi \sqrt{LC_r}} \quad (11)$$

The magnetic coupling between the resonance line elements can be dealt with, as in the case of the coil system shown in FIGS. 11A to 11D.

Figure 12D:
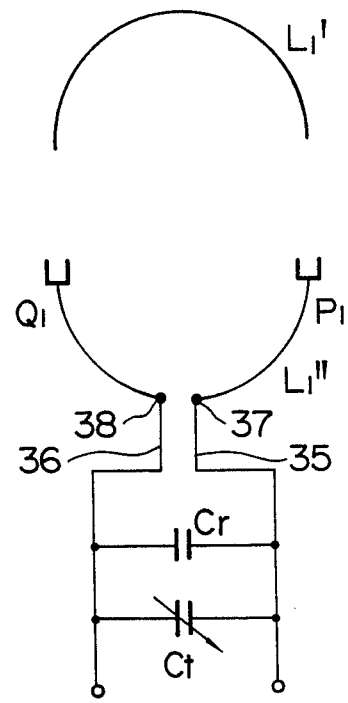

FIGS. 12D illustrates the manner in which the coil system is divided into the upper coil half and the lower coil half by means of two separable mechanical coupling elements $P_1$ and $Q_1$.

Figure 13A:
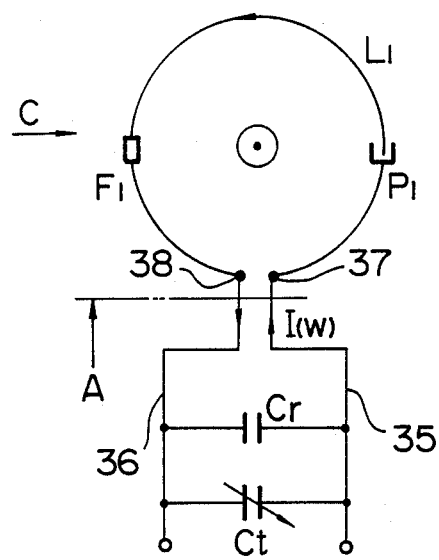
FIGS. 13A to 13D are views showing in more detail the structure of the coil system shown in FIG. 10G.
Figure 13B:
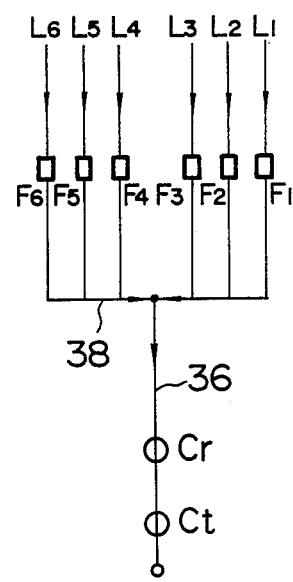
Figure 13D:
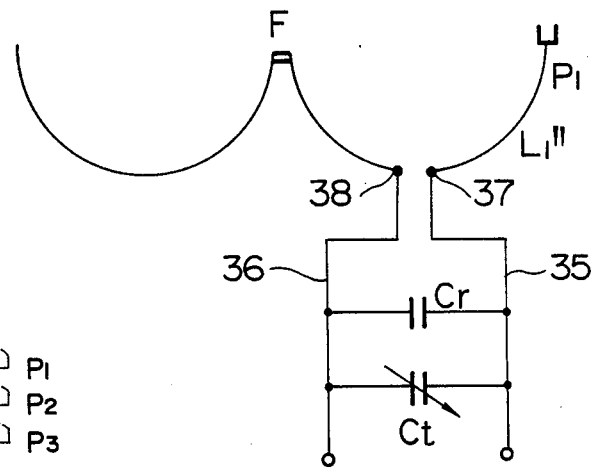
Figure 13C:
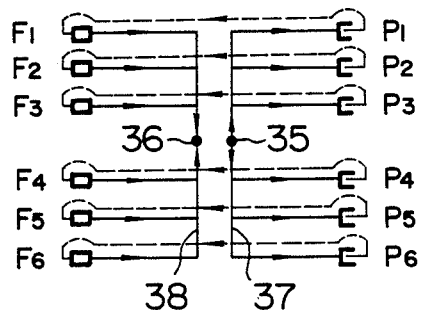

FIGS. 13A to 13D are views showing in greater detail the structure of the NMR coil system schematically shown in FIG. 10G, wherein FIG. 13C is a view taken in the viewing direction indicated by an arrow A in FIG. 13A while FIG. 13B is a view taken in the direction indicated by an arrow C in FIG. 13A. The instant embodiment of the NMR coil system also includes six resonance line elements similarly to the coil system shown in FIGS. 11A to 11D. The resonance line element incorporates no capacitor. The instant coil system has a resultant inductance given by $$\frac{1}{L} = \Sigma \frac{1}{L_i} \quad (i = 1, 2, 3, 4, 5, 6) \quad (10)$$

By this resultant inductance L and the externally mounted capacitor $C_r$ which is mounted externally to a resonance line element, the illustrated coil system is tuned to the NMR resonance frequency $f_o$ given by $$f_o = \frac{1}{2\pi \sqrt{LC_r}} \quad (11)$$

The magnetic coupling between the resonance line elements can be dealt with as in the case of the coil system shown in FIGS. 11A to 11D.

FIG. 13D shows the one-side opened state of the coil system in which the upper coil half is rotated half way about the flexible mechanical coupling element $F_1$. Reference symbol $P_1$ denotes the separable mechanical coupling element.

Figure 14A:
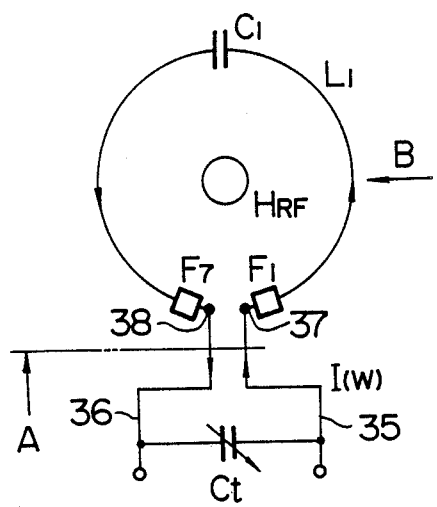
FIGS. 14A to 14D are views showing in more detail the structure of the coil system shown in FIG. 10H.
Figure 14B:
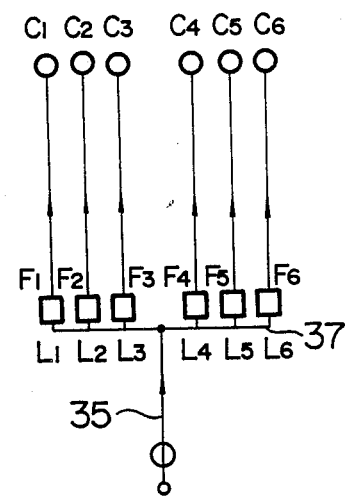
Figure 14C:
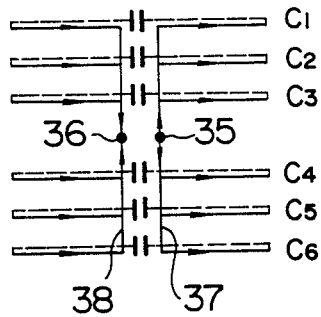

FIGS. 14A to 14D are views showing in more detail the structure of the NMR coil system shown schematically in FIG. 10H, wherein FIG. 14C is a view taken in the direction indicated by an arrow A in FIG. 14A and FIG. 14 is a view taken in the direction indicated by an error C in FIG. 14A. It should however be noted that in FIG. 14C, the flexible mechanical coupling elements $F_1$ to $F_{12}$ are omitted for the simplification of illustration. The instant embodiment of the NMR coil system includes six resonance line elements incorporating separable capacitors $C_1$ to $C_6$, respectively, and is implemented in the form of a distributed constant circuit tuned with the NMR resonance frequency $f_o$ given by $$f_o = \frac{1}{2\pi \sqrt{L_i O_i}} \quad (i = 1, 2, 3, 4, 5, 6) \tag{12}$$

The magnetic coupling between the resonance line elements can be dealt with similarly to the case of the coil system shown in FIGS. 11A to 11D.

Figure 14D:
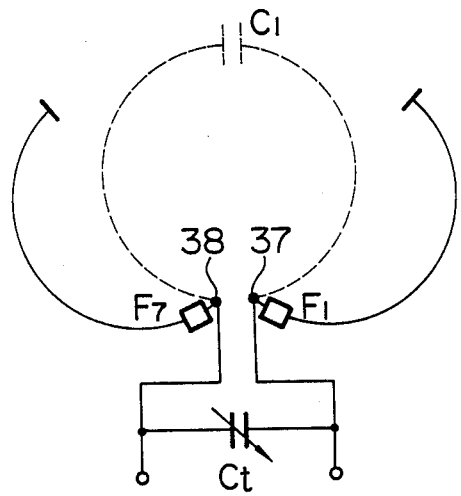

FIG. 14D shows the both-side opened state of the NMR coil system in which the left coil half and the right coil half are opened through counterclockwise and clockwise rotations about the flexible mechanical coupling elements $F_7$ and $F_1$, respectively. A reference symbol $C_i$ (shown as $C_1$ in FIG. 14D) represents the separable capacitor.

Figure 15A:
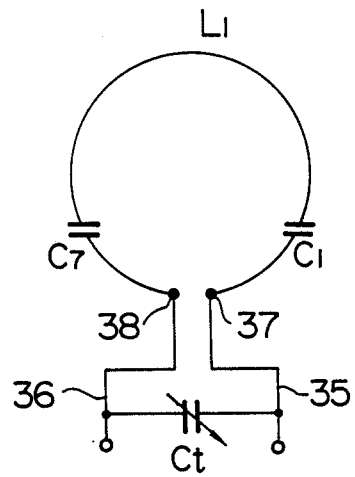
FIGS. 15A to 15C are schematic diagrams showing various modifications of the NMR high-frequency coil system belonging to the species shown in FIG. 10.
Figure 15C:
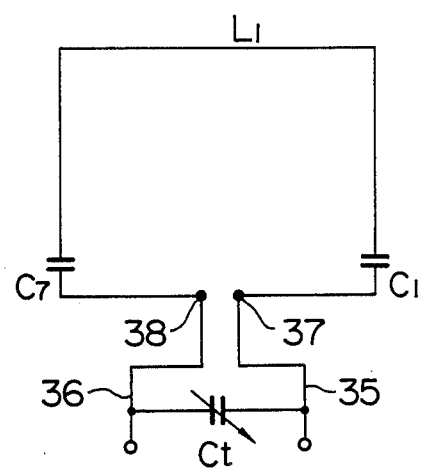
Figure 15B:
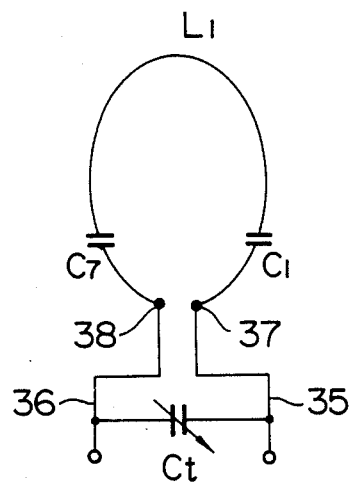

FIGS. 15A to 15C show modifications of the NMR coil system shown in FIG. 10A. In each of these modifications, it will be seen that the separable capacitors $C_7$ and $C_1$ are disposed such that the upper coil half and the lower coil half are asymmetrical to each other. This modified structure can also be applied to all of the coil systems shown in FIGS. 10A to 10I. In the coil system shown in FIG. 15A, the resonance line element is in a circular form. In the coil system shown in FIG. 15B, the resonance line element is in the form of an ellipse (including both ellipses elongated vertically and horizontally). In the coil system shown in FIG. 15C, the resonance line element is in a rectangular form (including a square form).

FIG. 16 shows in a perspective view an outer appearance of an embodiment of the one-side or both-side openable NMR coil system described hereinbefore by referring to FIGS. 10A to 10I. In FIG. 16, a reference numeral 40 denotes a casing for housing and holding therein the NMR coil system, numeral 41 denotes a dividing boundary at which the coil system is separably divided, and a numeral 42 denotes a pair of hinges serving as the flexible mechanical coupling element F when the coil system is implemented in the one-side openable structure. In the case of the both-side openable coil system (i.e. the coil system which is completely separated into two coil halves), the hinges 42 can of course be spared.

FIGS. 17A-17I show separably divisible structures of the solenoid-type high-frequency coil system. In these figures, symbol $L_i$ (i is a given integer) represents a resonance line element as well as inductance thereof, $C_i$ represents a separable capacitor as well as capacity thereof, $P_i$ and $Q_i$ represent separable mechanical coupling elements, respectively, $F_i$ represents a flexible mechanical coupling element, $H_{RF}$ represents a high-frequency magnetic field, $I(\omega)$ represents a high-frequency current, $C_r$ represents a capacitor for resonance, $C_t$ represents a capacitor for fine adjustment or tuning and reference numerals 43 and 44 designate lead wires, respectively.

Although the coil system is shown as being constituted by six turns of resonance line elements in FIGS. 17A to 17I, it will readily be understood that the number of the resonance line elements can be increased or decreased, as the case may be. Further, in the illustrated coil system, the center portion thereof is thin. However, the invention is never restricted to the illustrated winding configuration. Other suitable winding structure may equally be adopted. The solenoid type coil is widely employed for generation or radiation of a high-frequency magnetic field as well as detection of the NMR magnetic signal in the MRI apparatuses. Assuming that the high-frequency current $I(\omega)$ flows in the direction indicated by arrows, the high-frequency magnetic field $H_{RF}$ is generated in the axial direction of the set of resonance coil elements $L_i$. This in turn means that the presence of the high-frequency magnetic field gives rises to induction of a detection current in the coil system. The magnetic coupling between the resonance line elements can be handled in the same way in all the embodiments of the coil system. The capacitor $C_t$ is mounted externally to be employed for the fine tuning of the circuit to the NMR resonance frequency $f_o$. The coil system shown in FIG. 17A can be separably divided into upper and lower coil halves with the aid of the capacitors $C_1$ to $C_{12}$. In each of the resonance line elements, adjustment is made to tune with the NMR resonance frequency $f_o$ which is determined by the inductance $L_i$ and the capacity $C_i$, as follows:

$$f_o = \frac{1}{2\pi \sqrt{L_i C_i}} \quad (i = 1, 2, 3, 4, 5, 6) \tag{13}$$

For the purpose of simplification, it is assumed that $$C_1 = C_7, C_2 = C_8, C_3 = C_9, C_4 = C_{10}, C_5 = C_{11}, C_6 = C_{12} \tag{14}$$

The coil system is thus in the form of a distributed constant circuit.

Figure 17A:
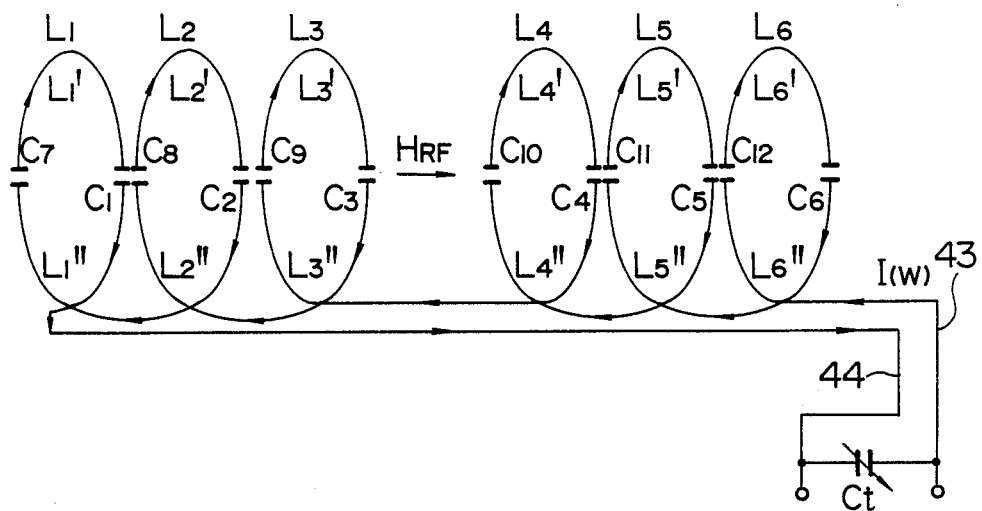
FIGS. 17A to 17I are schematic diagrams showing further embodiments of the present invention.
Figure 17B:
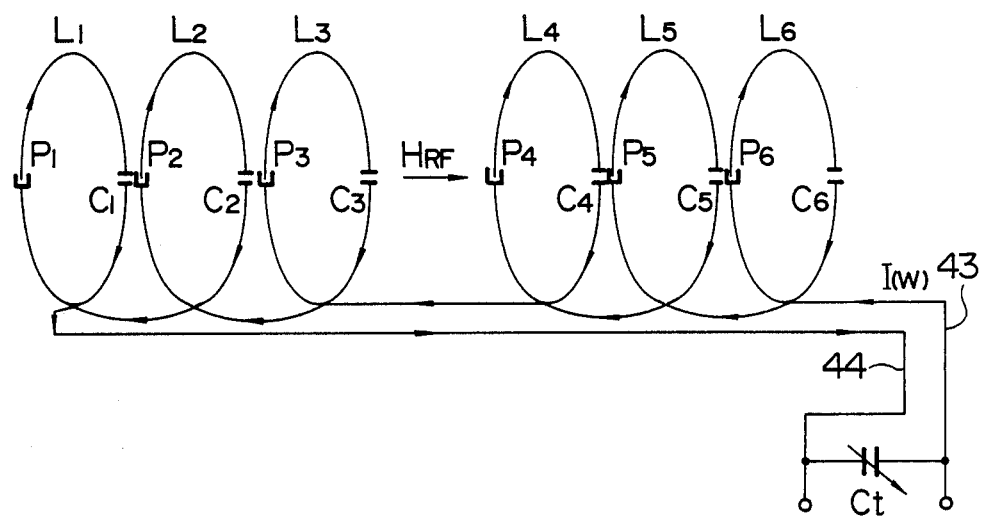

The coil system shown in FIG. 17B can be separably divided into two parts (i.e. the upper coil half and the lower coil half) by means of the separable capacitors $C_1$ to $C_6$ and the separable mechanical coupling elements $P_1$ to $P_6$.

In each of the resonance line elements, adjustment is performed to tune with the NMR resonance frequency $f_o$ determined by the inductance $L_i$ and the capacity $C_i$ as follows:

$$f_o = \frac{1}{2\pi \sqrt{L_i C_i}} \quad (i = 1, 2, 3, 4, 5, 6) \tag{15}$$

Thus, the coil system shown in FIG. 17B is also a distributed constant circuit.

Figure 17C:
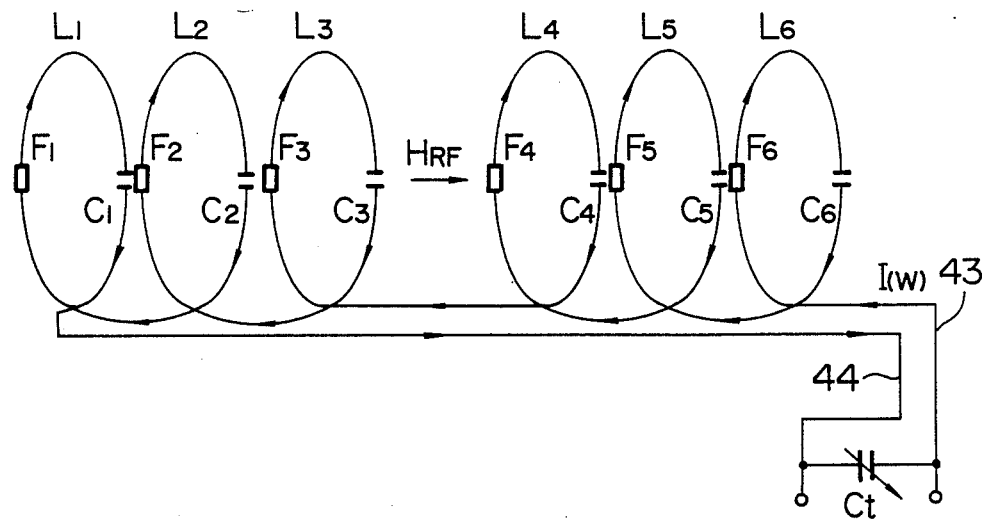

The coil system shown in FIG. 17C is one-side openable through rotation about the axis extending through the flexible mechanical coupling elements $F_1$ to $F_6$, being separably divided at the locations of the separable capacitors $C_1$ to $C_6$.

As in the case of the NMR system shown in FIG. 17B, each of the resonance line elements is tuned to the NMR resonance frequency $f_o$ determined by the inductance $L_i$ and the capacity $C_i$ as follows:

$$f_o = \frac{1}{2\pi\sqrt{L_iC_i}} \quad (i = 1, 2, 3, 4, 5, 6) \tag{15}$$

The instant coil system thus can be represented by a distributed constant circuit. The coil system shown in FIG. 17D can be separably divided into two halves by means of the separable mechanical coupling elements $P_1$ to $P_6$ and the separable mechanical coupling elements $Q_1$ to $Q_6$. In the case of the instant coil system, the capacitors $C_1$ to $C_6$ may be standard capacitors rather than the separable capacitors.

In each of the resonance line elements, adjustment is performed to tune with the NMR resonance frequency $f_o$ determined by the inductance $L_i$ and the capacity $C_i$ as follows:

$$f_o = \frac{1}{2\pi\sqrt{L_iC_i}} \quad (i = 1, 2, 3, 4, 5, 6) \tag{15}$$

Figure 17D:
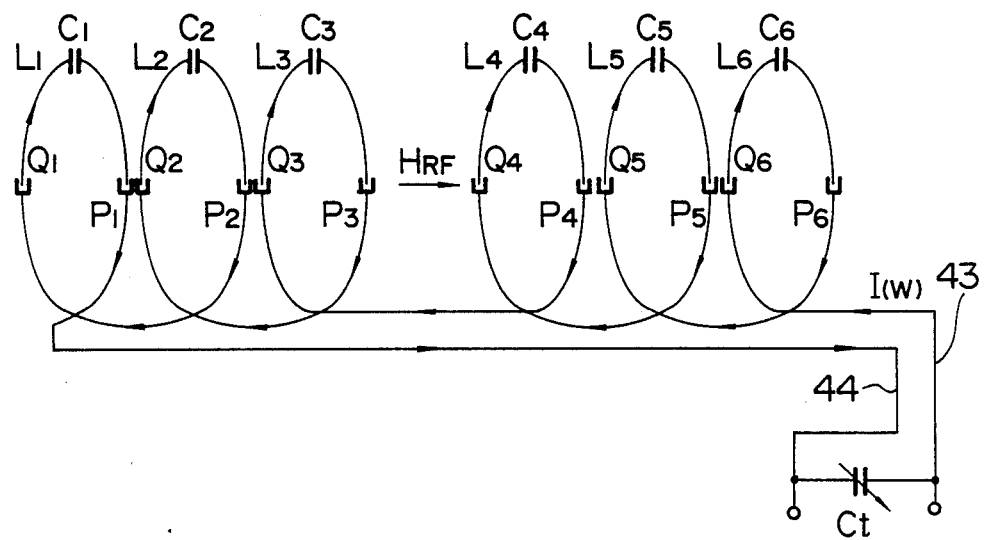

Thus, the coil system shown in FIG. 17D is also a distributed constant circuit.

Figure 17E:
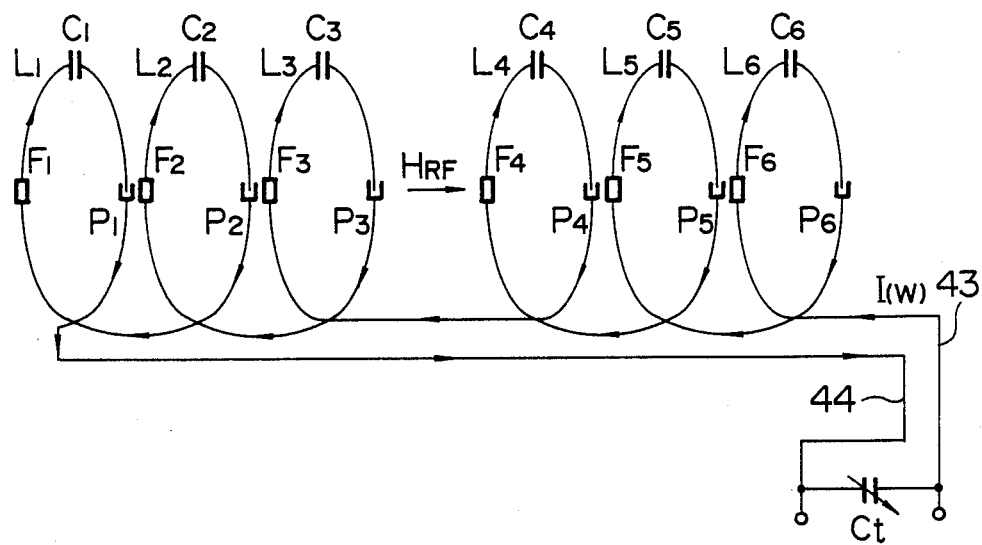

The coil system shown in FIG. 17E is a one-side openable coil system which can be separably divided at the separable mechanical coupling elements $P_1$ to $P_6$ into two parts by rotating counterclockwise the upper coil half around the axis extending through the flexible mechanical coupling elements $F_1$ to $F_6$. The capacitors $C_1$ to $C_6$ may be ordinary capacitors rather than the separable capacitors.

In each of the resonance line elements, adjustment is performed to tune with the NMR resonance frequency $f_o$ determined by the inductance $L_i$ and the capacity $C_i$ as follows:

$$f_o = \frac{1}{2\pi\sqrt{L_iC_i}} \quad (i = 1, 2, 3, 4, 5, 6) \tag{15}$$

Thus, the coil system shown in FIG. 17E is also a distributed constant circuit.

Figure 17F:
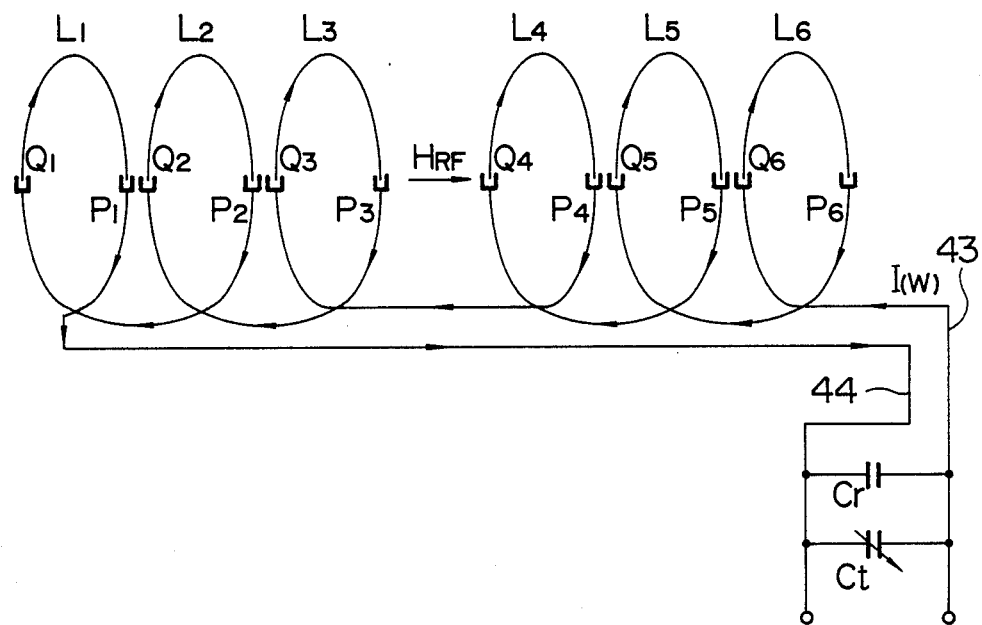

The coil system shown in FIG. 17F can be separably divided into two parts (i.e. the upper coil half and the lower coil half) by means of the separable capacitors, mechanical coupling elements $P_1$ to $P_6$ and $Q_1$ to $Q_6$ as in the case of the coil system shown in FIG. 17D. The resonance line element incorporates no capacitor. Tuning with the NMR resonance frequency $f_o$ is accomplished with the resultant inductance $L_r$ and the externally mounted capacitors $C_r$. The combined inductance $L_r$ and the NMR frequency $f_o$ are, respectively, given as follows:

$$L_r = L_1 + L_2 + L_3 + L_4 + L_5 + L_6 \tag{16}$$

$$f_o = \frac{1}{2\pi\sqrt{L_rC_r}} \tag{17}$$

Figure 17G:
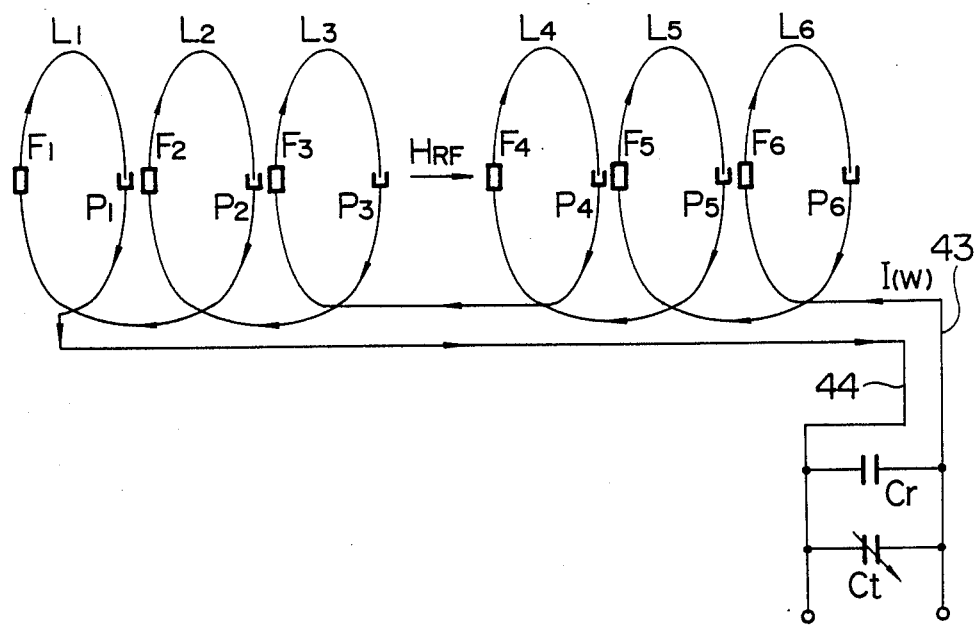

FIG. 17G shows a one-side openable coil system similar to the embodiment shown in FIG. 17E and can be separably divided into two coil halves at the separable mechanical coupling elements $P_1$ to $P_6$ by rotating one coil half relative to the other around the axis extending through the flexible mechanical coupling elements $F_1$ to $F_6$. As in the case of the embodiment shown in FIG. 17F, the tuning to the NMR frequency $f_o$ is accomplished with the aid of a resultant inductance $L_r$ and the externally mounted capacitor $C_r$. The resultant inductance $L_r$ and the NMR resonance frequency $f_o$ are, respectively, given as follows:

$$L_r = L_1 + L_2 + L_3 + L_4 + L_5 + L_6 \tag{16}$$

$$f_o = \frac{1}{2\pi\sqrt{L_rC_r}} \tag{17}$$

Figure 17H:
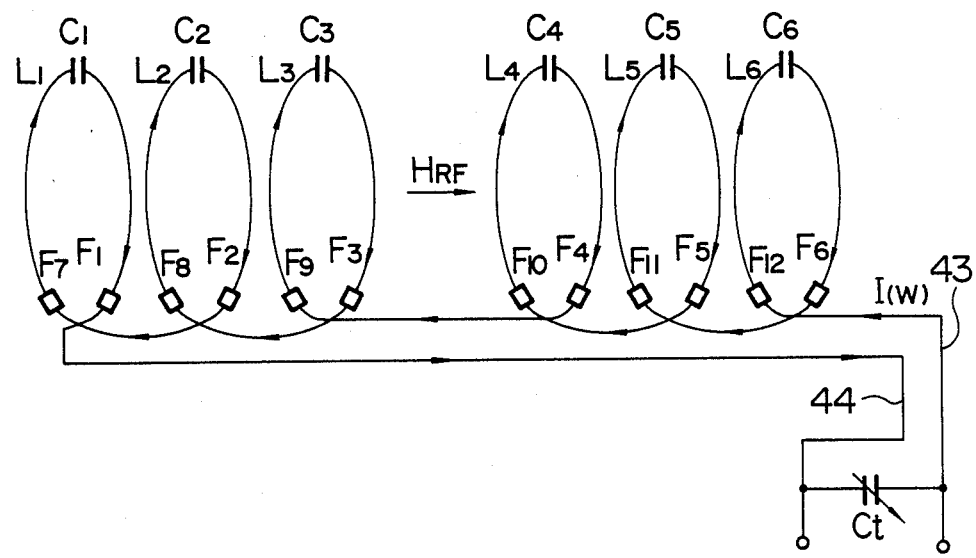

FIG. 17H shows a both-side openable coil system which can be separably divided into two coil halves at the separable capacitors $C_1$ to $C_6$ by rotating both coil havles in the opposite directions around the axes extending through the flexible mechanical coupling elements $F_1$ to $F_6$ and $F_7$ to $F_{12}$, respectively. In each of the resonance line elements, tuning to the NMR resonance frequency $f_o$ is established with the aid of the line inductance $L_i$ and the capacity $C_i$, as follows:

$$f_o = \frac{1}{2\pi\sqrt{L_iC_i}} \quad (i = 1, 2, 3, 4, 5, 6) \tag{15}$$

The coil system shown in FIG. 17H is also a distributed constant circuit.

Figure 17I:
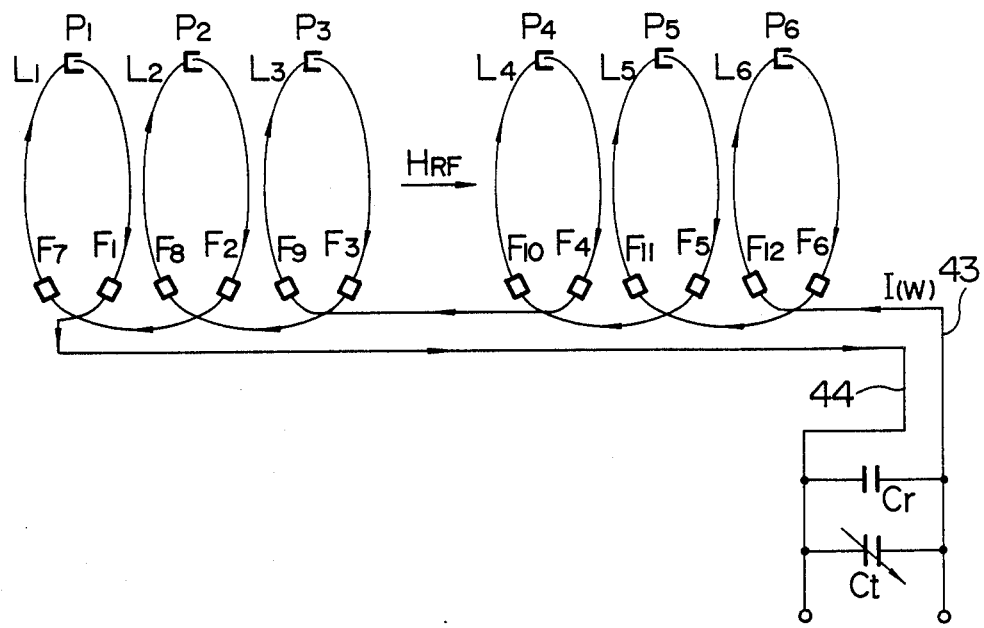

FIG. 17I shows another both-side openable NMR coil system which can be separably divided into two coil halves at the seprable mechanical coupling elements $P_1$ to $P_6$ by rotating both coil halves around the axes extending through the flexible mechanical coupling elements $F_1$ to $F_6$ and $F_7$ to $F_{12}$, respectively. The resonance line element incorporates no capacitor. Tuning to the NMR resonance frequency $f_o$ is accomplished with the aid of a combined inductance $L_r$ and the externally mounted capacitor $C_r$. Namely, $$L_r = L_1 + L_2 + L_3 + L_4 + L_5 + L_6 \tag{16}$$

$$f_o = \frac{1}{2\pi\sqrt{L_rC_r}} \tag{17}$$

Figure 18A:
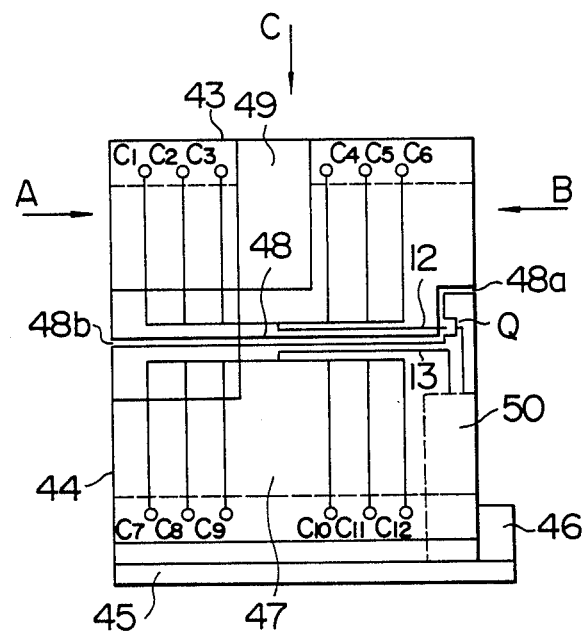
FIGS. 18A to 18D are schematic diagrams showing a version of the NMR high-frequency coil system shown in FIGS. 2A to 2F.
Figure 18B:
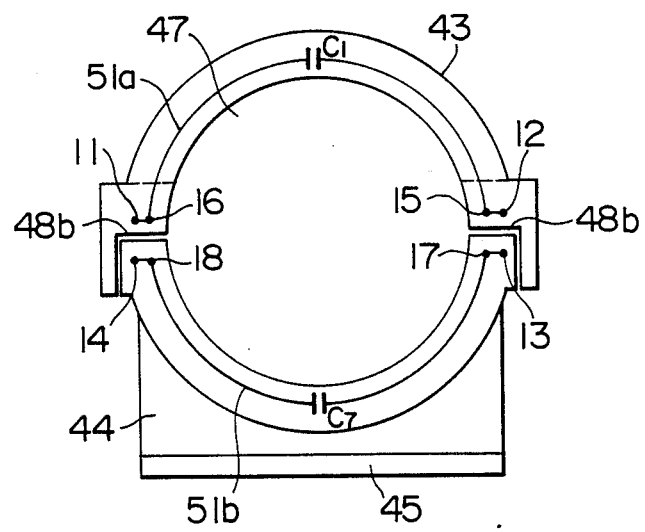
Figure 18C:
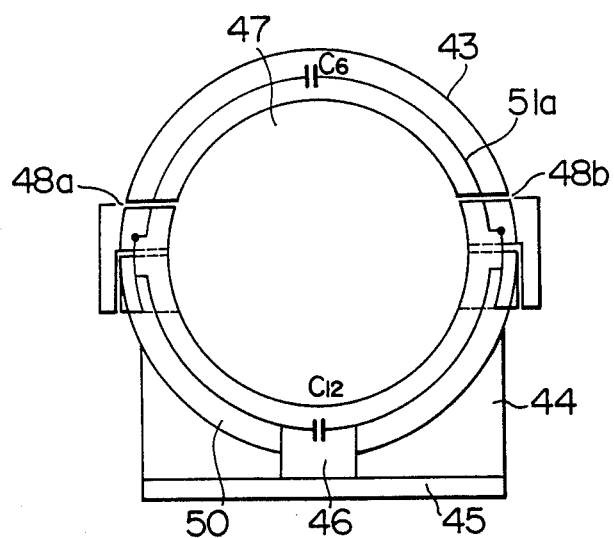
Figure 18D:
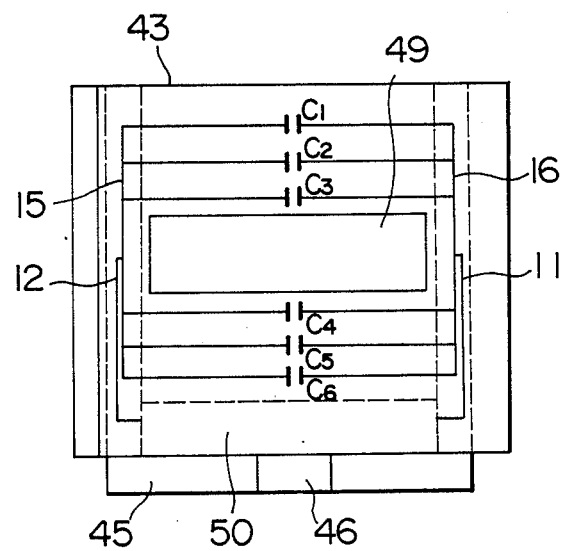
Figure 20A:
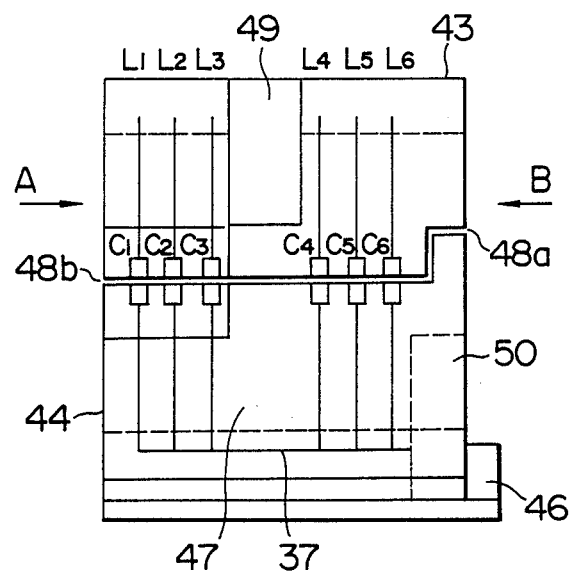
FIGS. 20A to 20D are diagrams showing in more detail the coil systems of FIGS. 11A to 11D.
Figure 20B:
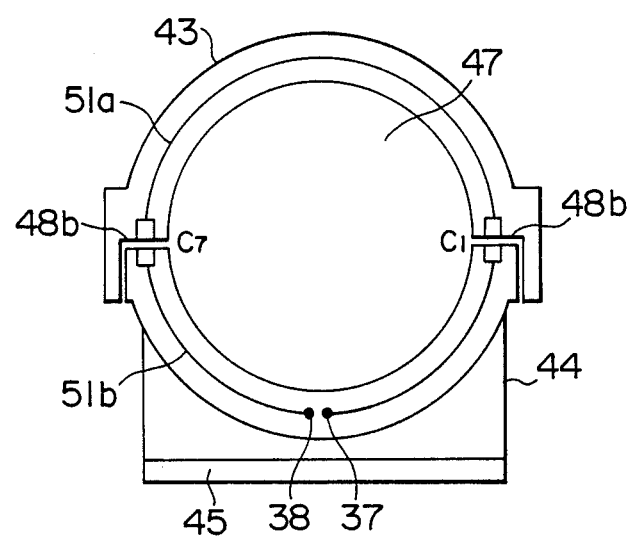
Figure 20C:
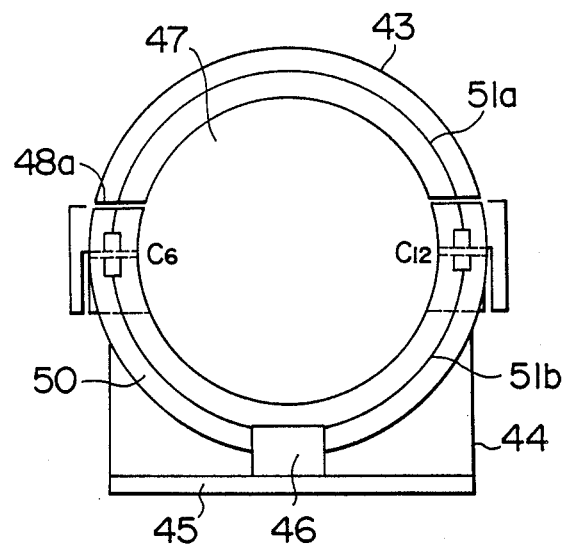
Figure 20D:
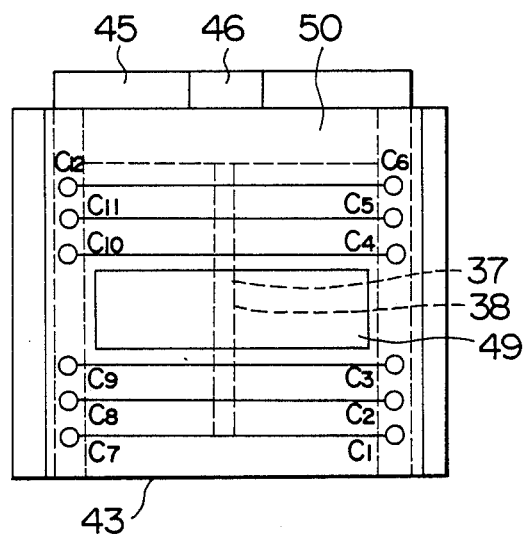

A concrete embodiment of the coil system described hereinbefore in conjunction with FIG. 1 and FIGS. 2A to 2E is illustrated in FIGS. 18A to 18D, wherein FIG. 18A is a side view of the embodiment, 18B is a view of the same taken in the direction indicated by an arrow A in FIG. 18A, FIG. 18C is a view taken in the direction B, and FIG. 18D is a view taken in the direction C in FIG. 18A. The illustrated coil system can advantageously be used as the NMR magnetic signal detecting coil in the permanent-magnet type MRI (nuclear magnetic resonance imaging) apparatus.

Figure 2B:
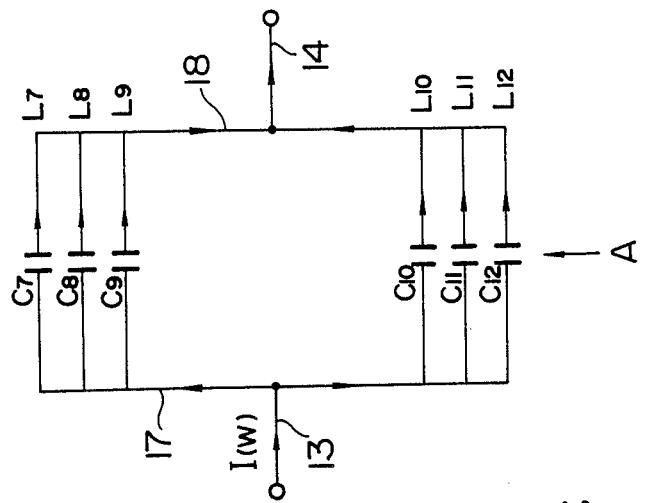
FIGS. 2A to 2F are schematic diagrams illustrating still another embodiment of the NMR high-frequency coil system according to the invention.
Figure 2A:
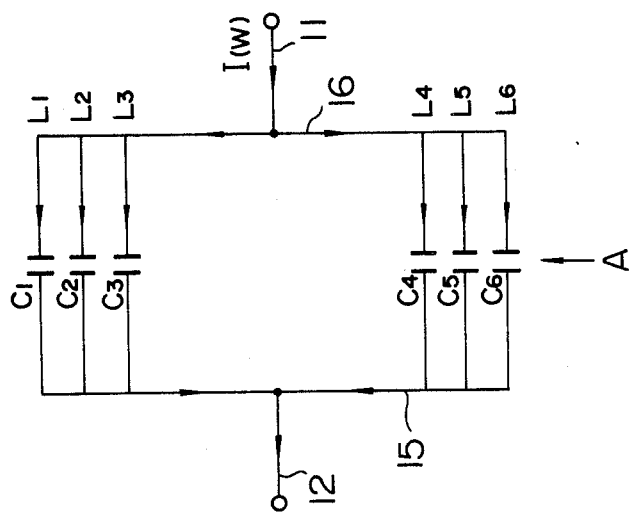
Figure 2C:
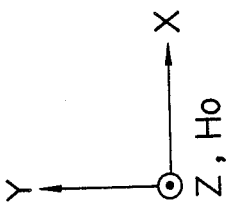
Figure 2D:
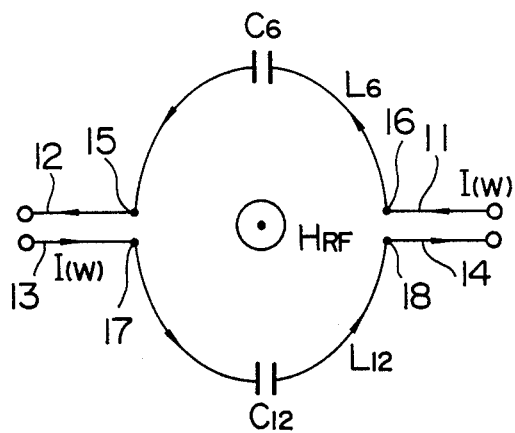
Figure 2F:
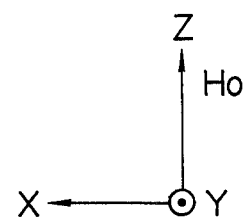
Figure 2E:
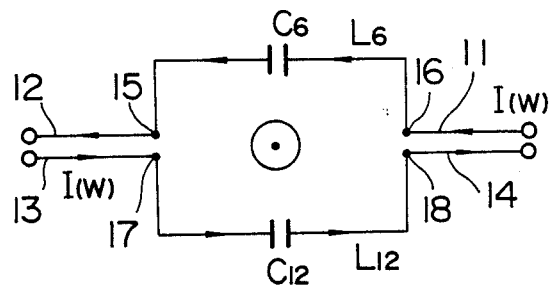
Figure 3B:
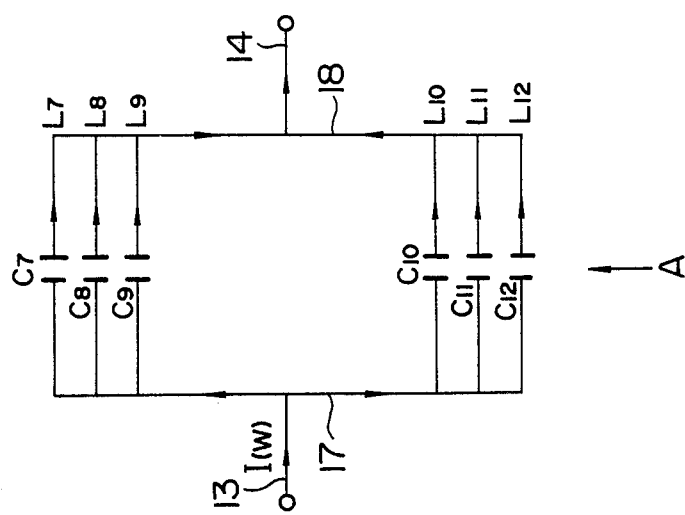
FIGS. 3A to 3F are schematic diagrams showing a further embodiment of the NMR high-frequency coil system according to the invention.
Figure 3A:
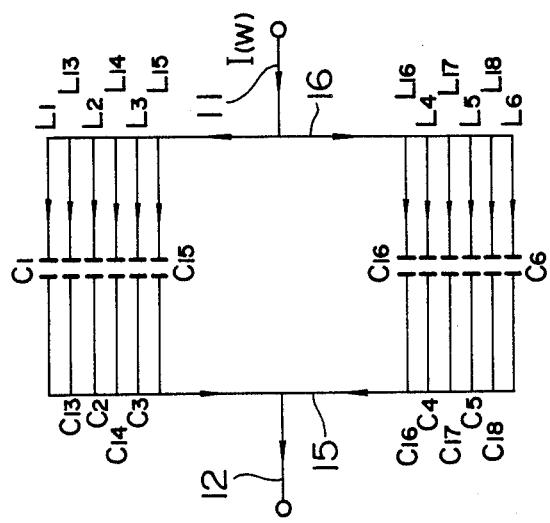
Figure 3C:
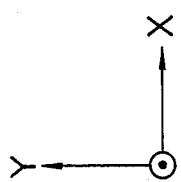
Figure 3D:
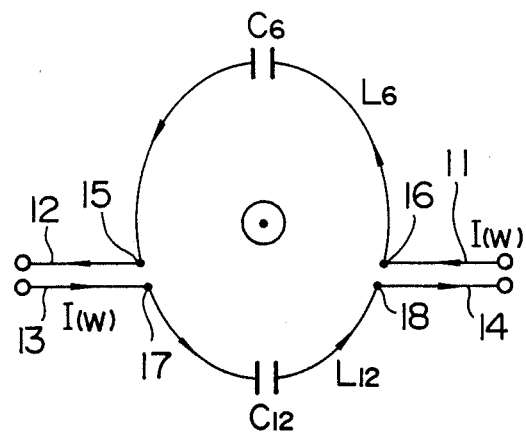
Figure 3F:
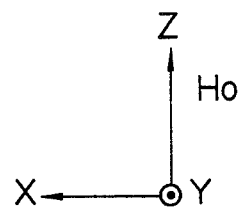
Figure 3E:
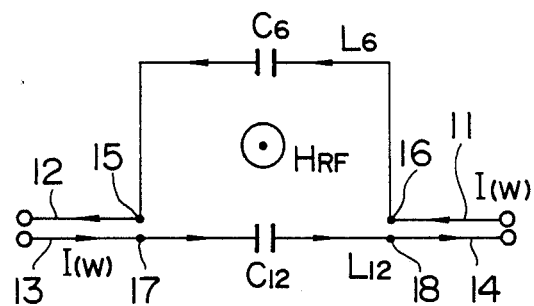

Although the intra-coil space 47 of the coil system shown in FIG. 18 is circular in the X-Z plane, it will readily be understood that the intra-coil space 47 may be elliptical or rectangular or square, as shown in FIG. 2D or FIG. 2E. The coil system is separably divided into two halves in the vertical direction (Z-direction).

Each of the upper and lower coil halves has six resonance wire elements. However, the number thereof can be decreased or increased as the case may be. A window 49 is formed at a center portion which is effective in mitigating the feeling of oppression of the patient.

The upper and lower coil halves including the resonance line or wire elements 51a and 51b are covered by and held within casings 43 and 44, respectively, which may be made of a non-metallic material such as, for example, glass fiber reinforced plastic (GFRP). The upper casing 43 is implemented in a structure facilitating the attachment and removal thereof. The lower casing 44 is provided with a base portion 45 and adapted to be easily installed on a top plate of a patient table while being able to be removed therefrom as desired. As will readily be seen from the figures, the upper and lower coil halves can be separated from each other at the portions 48, 48a and 48b, where the separation 48 determines the positions of the upper and lower coil halves in the Z-direction, 48a denotes the position of the same in the Y-direction and 48b denotes the corresponding position in the X-direction. Simultaneously with the positioning of the portion 48a in the Y-direction, the upper half coil circuit and the lower half coil circuit are electrically coupled to each other by the separable mechanical coupling elements P and Q (only the element Q is shown in FIGS. 18A to 18D, being understood that the separable mechanical coupling element P is of the same structure as the mechanism Q).

As can be seen in FIG. 1, FIGS. 2A to 2E and FIG. 19, the lead wires 12 and 13 are disposed closely to each other (same applied to the lead wires 11 and 14) so that the generated magnetic fixed by these wires can mutually be canceled out. The wire elements 15 and 17 as well as the wire elements 16 and 18 are, respectively, disposed closely adjacent to each other, so that the magnetic fields as generated by each pair of these wires can mutually be canceled out.

The instant embodiment of the coil system is realized in the form of a distributed constant circuit including the capacitances $C_1$ to $C_{12}$, which may however be spared.

FIG. 19 shows a wiring diagram of the embodiment shown in FIGS. 18A to 18D. Reference symbols $L_{T1}$ and $L_{T2}$ represents, respectively, the resonance line (wire) elements of the upper and lower coil halves, respectively, and $C_{T1}$ and $C_{T2}$ represent capacitances of the resonance capacitors incorporated in upper and lower coil halves. A reference symbol $C_t$ represents a capacitor for fine tuning or adjustments. When neither capacitance $C_{T1}$ nor $C_{T2}$ are incorporated, a resonance capacitor $C_r$ is connected in parallel with the capacitor $C_t$. Symbols P and Q represent, respectively, the separable mechanical coupling elements described hereinbefore 50 represents an impedance matching box and 52 an amplifier.

FIGS. 20A to 20D show a concrete embodiment of the coil systems described hereinbefore in conjunction with FIG. 10A and FIGS. 11A to 11D. The reference symbols used in FIGS. 20A to 20D which are same as those in FIG. 10A and FIGS. 11A to 11D have the same meanings as those used in the latter. Any further description of these parts will therefore be unnecessary. Symbols $C_1$ to $C_{12}$ represent separable capacitors, by means of which the coil system of concern can be divided into upper and lower coil halves. The positioning in the X-, Y- and Z-directions is same as in the case of the embodiment shown in FIG. 18. Lead wires 37 and 38 are led to an impedance matching box 50 to be connected to the capacitor $C_t$ for the fine tuning.

The solenoid coil of the MRI apparatus known heretofore gives to the person to be diagnosed a feeling of fear and a sense of oppression. In contrast, the coil systems according to the present invention which may be effectively employed in the MRI apparatus for diagnosing the head portion of the human body can be separated into the upper coil half and the lower coil half, wherein the lower coil half can serve as a pillow, with the upper coil half being disposed above the head after it has been positioned in place. Thus, not only the feeling of uneasiness and oppression can be eliminated but also the manipulatability can be improved. Further, the coil system of an increased filling factor can be realized, whereby the NMR detection sensitivity can be improved in the imaging operation.

I claim:

1. In a nuclear magnetic resonance signal detecting system in which a body subject to measurement placed in a static magnetic field is irradiated with a magnetic field of high frequency by means of a high-frequency magnetic field radiating coil and in which a nuclear magnetic resonance signal of said body is detected by means of a nuclear magnetic resonance signal detecting coil, a high-frequency coil system for the nuclear magnetic resonance comprising a plurality of coil groups including a plurality of coils juxtaposed to on another in a predetermined direction in one of a loop-like form and a solenoid-like form around the predetermined direction, each of the plurality of coils being implemented in such a structure as to be divisible in a direction orthogonal to the predetermined direction, for detecting a magnetic field in an axial direction coinciding with an axis extending through said coil groups and/or generating a magnetic field in said axial direction.

2. A high-frequency coil system according to claim 1, wherein at least two of said divisible coils include positioning means for determining mutual positions of said coils in X-, Y- and Z-directions.

3. A high-frequency coil system according to claim 1, wherein at least two divisible coils are provided with a common bore at a given location.

4. A high-frequency coil system according to claim 1, wherein a lower one of at least two of said divisible coils has a predetermined configuration for enabling ease of installation.

5. A high-frequency coil system according to claim 1, wherein when said axial direction is represented the Y-axis direction, while one direction orthogonal to said axial direction is represented by the X-axis direction with another direction orthogonal to said axial direction being represented by the Z-axis direction, said high-frequency coil system includes structural arrangements in which (a) when said coil groups are viewed in the Z-direction, at least two resonance line elements extending in the X-direction are present between at least two line elements extending in parallel with each other in the Y-direction, each of said resonance line elements being of a desired shape; and (b) when said coil groups are viewed in the Y-direction, at least two circuit networks each of said structural arrangement (a) are present, wherein said line elements extending in the Y-direction in each of said at least two circuit networks are positioned closely in opposition to each other when said at least two divisible structures are unified, said line elements extending in the Y-direction in both of said at least two divisible structures being so disposed that currents flow through said line elements in the directions opposite to each other.

6. A high-frequency coil system according to claim 5, wherein each of said resonance line elements extending in the X-direction has at least one electrostatic capacity element connected in series for tuning with the frequency of said magnetic resonance in each of said resonance line elements.

7. A high-frequency coil system according to claim 5, wherein when said at least two divisible structures are unified, a plurality of lead wires connected to said line elements of said divisible structures for conducting a high-frequency current are grouped pairwise in sets each including two lead wires in which said current flows in the directions in opposition to each other and which are held closely to each other.

8. A high-frequency coil system according to claim 5, wherein said plurality of lead wires connected to said resonance line elements of said divisible structures for conducting a high-frequency current in a same direction in the unified state of said divisible structures are collected and interconnected at a location remote from said unified divisible structures, whereby two lead wires in which the detection currents flow in the directions in opposition to each other are formed.

9. A high-frequency coil system according to claim 8, wherein said interconnection is realized by coupling the lead wire terminal of a movable one of said divisible structures to the lead wire of the other divisible structure by means of a detachable electrical coupling mechanism.

10. A high-frequency coil system according to claim 5, wherein a tuning electrostatic capacity element for fine tuning with said nuclear magnetic frequency is mounted externally to said resonance line elements.

11. A high-frequency coil system according to claim 1, wherein when said axial direction is represented by the Y-axis direction, while one direction orthogonal to said axial direction is represented by the X-axis direction with another direction orthogonal to said axial direction being represented by the Z-direction, said high-frequency coil system includes structural arrangements in which
   (a) when said coil groups are viewed in the Z-direction, two line elements extending in parallel in said Y-axis direction are disposed closely to each other, wherein at least two coils are connected in parallel across said two line elements,
   (b) a lead wire is connected to each of said two line elements, wherein the two lead wires are positioned closely to each other in the vicinity of said connection,
   (c) said coils being of a given shape as viewed in said Y-axis direction,
   (d) positions and inter-space of said coils juxtaposed in said Y-axis direction are determined arbitrarily and,
   (e) each of said coils includes dividing means at a given position.

12. A high-frequency coil system according to claim 11, wherein a tuning electrostatic capacity element for fine tuning with said nuclear magnetic frequency is mounted externally to said coils.

13. A high-frequency coil system according to claim 1, wherein when said axial direction is represented by the Y-axis direction, while one direction orthogonal to said axial direction is represented by the X-axis direction with another direction orthogonal to said axial direction being represented by the Z-axis direction, said high-frequency coil system includes structural arrangements of coils in which
   (a) when the coils are viewed slantly, each of said coils is connected in series to thereby form a solenoid-type coil assembly,
   (b) said coils, are of a given predetermined shape as viewed in the Y-axis direction,
   (c) positional relationship between said coils is determined arbitrarily, and
   (d) each of said coils includes dividing means at a given position.

14. A high-frequency coil system according to claim 13, wherein a tuning electrostatic capacity element for fine tuning with said nuclear magnetic frequency is mounted externally to said coils.

15. A high-frequency coil system according to claim 11, wherein each of said coils includes two separable electrostatic capacity elements connected in series so that said coils can be separably divided into upper and lower coil halves at the positions of said separable electrostatic capacity elements.

16. A high-frequency coil system according to claim 13, wherein each of said coils includes two separable electrostatic capacity elements connected in series so that said coils can be separably divided into upper and lower coil halves at the positions of said separable electrostatic capacity elements.

17. A high-frequency coil system according to claim 11, wherein each of said coils includes one separable electrostatic capacity element and one separable mechanical coupling element connected in series so that said coils can be divided into upper and lower coil halves at the positions of said separable electrostatic capacity element and said separable mechanical coupling element.

18. A high-frequency coil system according to claim 13, wherein each of said coils includes one separable electrostatic capacity element and one separable mechanical coupling element connected in series so that said coils can be divided into upper and lower coil halves at the positions of said separable electrostatic capacity element and said separable mechanical coupling element.

19. A high-frequency coil system according to claim 11, wherein each of said coils includes two separable mechanical coupling elements connected in series so that said coils can be divided into upper and lower halves at the positions of said separable mechanical coupling elements.

20. A high-frequency coil system according to claim 13, wherein each of said coils includes two separable mechanical coupling elements connected in series so that said coils can be divided into upper and lower halves at the positions of said separable mechanical coupling elements.

21. A high-frequency coil system according to claim 11, wherein each of said coils includes one separable electrostatic capacity element and one flexible mechanical coupling element connected in series so that said coils can be divided into two parts by rotating one of said parts relative to the other part about said flexible mechanical coupling element.

22. A high-frequency coil system according to claim 13, wherein each of said coils includes one separable electrostatic capacity element and one flexible mechanical coupling element connected in series so that said coils can be divided into two parts by rotating one of said parts relative to the other part about said flexible mechanical coupling element.

23. A high-frequency coil system according to claim 11, wherein each of said coils includes one separable mechanical coupling element and one flexible mechanical coupling element connected in series so that said coils can be divided into two coil parts by rotating one of said coil parts relative to the other coil part about said flexible mechanical coupling element.

24. A high-frequency coil system according to claim 13, wherein each of said coils includes one separable mechanical coupling element and one flexible mechanical coupling element connected in series so that said coils can be divided into two coil parts by rotating one of said coil parts relative to the other coil part about said flexible mechanical coupling element 25. A high-frequency coil system according to claim 11, wherein each of said coils includes one separable electrostatic capacity element and two flexible mechanical coupling elements connected in series so that said coils can be divided at the position of said separable electrostatic capacity element into two parts capable of being opened in opposite directions rotatably about said flexible mechanical coupling elements, respectively.

26. A high-frequency coil system according to claim 13, wherein each of said coils includes one separable electrostatic capacity element and two flexible mechanical coupling elements connected in series so that said coils can be divided at the position of said separable electrostatic capacity element into two parts capable of being opened in opposite directions rotatably about said flexible mechanical coupling elements, respectively.

27. A high-frequency coil system according to claim 11, wherein each of said coils includes one separable mechanical coupling element and two flexible mechanical coupling elements connected in series so that said coils can be divided at the position of said separable mechanical coupling element into two parts capable of being opened in opposite directions rotatably about said flexible mechanical coupling elements, respectively.

28. A high-frequency coil system according to claim 13, wherein each of said coils includes one separable mechanical coupling element and two flexible mechanical coupling elements connected in series so that said coils can be divided at the position of said separable mechanical coupling element into two parts capable of being opened in opposite directions rotatably about said flexible mechanical coupling elements, respectively.

29. A high-frequency coil system according to claim 11, wherein each of said coils includes a separable electrostatic capacity element and/or an ordinary electrostatic capacity element connected in series.

30. A high-frequency coil system according to claim 11, wherein each of said coils includes a coil member without an electrostatic capacity element.

31. A high-frequency coils system according to claim 13, wherein each of said coils includes a separable electrostatic capacity element and/or an ordinary electrostatic capacity element connected in series.

32. A high-frequency coil system according to claim 13, wherein each of said coils includes a coil member without an electrostatic capacity element.

33. In a nuclear magnetic resonance signal detecting system in which a body subject to measurement placed in a static magnetic field is irradiated with a magnetic field of high frequency and in which a nuclear magnetic resonance signal of said body is detected, the improvement comprising a high frequency coil system for nuclear magnetic resonance including a plurality of coils juxtaposed to one another in a predetermined direction in one of a loop-like form and a solenoid-like form around the predetermined direction, each of the plurality of coils being divisible in a direction different from the predetermined direction.

34. A high-frequency coil system according to claim 33, wherein the different direction is a direction orthogonal to the predetermined direction.

35. A high-frequency coil system according to claim 33, wherein at least two of said divisible coils include positioning means for determining neutral positions of said coils in X-, Y- and Z-directions.

36. A high-frequency coil system according to claim 33, wherein at least two divisable coils are provided with a common bore at a given location.

37. A high-frequency coil system according to claim 33, wherein said high-frequency coil system enables detection of a magnetic field in an axial direction coinciding with an axis extending through said plurality of coils and/or for generating a magnetic field in said axial direction.

38. A high-frequency coil system according to claim 37, wherein when said axial direction is represented by the Y-axis direction, one direction orthogonal to said axial direction is represented by the X-axis direction with another direction orthogonal to said axial direction being represented by the Z-axis direction, said high-frequency frequency coil system includes structural arrangements in which
 (a) when said coils are viewed in the Z-direction, at least two resonance line elements extending in the X-direction are present between at least two line elements extending in parallel with each other in the Y-direction, each of said resonance line elements being of a desired shape; and
 (b) when said coils are viewed in the Y-direction, at least two circuit networks in each of said structural arrangements (a) are present, wherein said line elements extending in the Y-direction in each of said at least two circuit networks are positioned closely in opposition to each other when said at least two divisible coils are unified, said line elements extending in the Y-direction in both of said at least two divisible coils being so disposed that currents flow through said line elements in directions opposite to each other.

* * * * *